US008319395B2

(12) United States Patent
Kosaka et al.

(10) Patent No.: US 8,319,395 B2

(45) Date of Patent: Nov. 27, 2012

(54) POWER SUPPLY DEVICE AND IMAGE FORMING APPARATUS

(75) Inventors: Toru Kosaka, Tokyo (JP); Akira Hagiwara, Tokyo (JP)

(73) Assignee: Oki Data Corporation, Tokyo (JP)

( * ) Notice: Subject to any disclaimer, the term of this patent is extended or adjusted under 35 U.S.C. 154(b) by 415 days.

(21) Appl. No.: 12/703,242

(22) Filed: Feb. 10, 2010

(65) Prior Publication Data

US 2010/0202794 A1 Aug. 12, 2010

(30) Foreign Application Priority Data

Feb. 12, 2009 (JP) ................................ 2009-030081

(51) Int. Cl.
*H01L 41/107* (2006.01)

(52) U.S. Cl. ...................................... 310/318; 310/319

(58) Field of Classification Search .................. 310/318, 310/319
See application file for complete search history.

(56) References Cited

U.S. PATENT DOCUMENTS

| | | | | |
|---|---|---|---|---|
| 7,548,708 | B2 * | 6/2009 | Nagasaki et al. | 399/88 |
| 8,174,200 | B2 * | 5/2012 | Kosaka et al. | 315/209 PZ |
| 2010/0135698 | A1 * | 6/2010 | Nemoto | 399/168 |
| 2011/0142478 | A1 * | 6/2011 | Takayama et al. | 399/88 |

FOREIGN PATENT DOCUMENTS

JP 2006-091757 A 4/2006

* cited by examiner

*Primary Examiner* — Thomas Dougherty
(74) *Attorney, Agent, or Firm* — Marvin A. Motsenbocker; Mots Law, PLLC

(57) ABSTRACT

A power supply device includes: an oscillator configured to output a clock signal; a pulse output unit configured to output a pulse by dividing the frequency of the clock signal; a switching element driven by the pulse; a piezoelectric transformer configured to intermittently receive a voltage from the switching element and to output a high alternating current voltage; a rectifier configured to convert the high alternating current voltage to a high direct current voltage; an output voltage conversion unit configured to convert the high direct current voltage to a low direct current voltage; a target setter configured to output a target value; and a comparison unit configured to compare the low direct current voltage with the target value and to output a comparison result. A frequency division ratio of the pulse is controlled according to the comparison result, and thereby is changed so as to obtain the target value.

16 Claims, 16 Drawing Sheets

POWER SUPPLY DEVICE OF FIRST EMBODIMENT

IMAGE FORMING APPARATUS OF FIRST EMBODIMENT

CONTROL CIRCUIT SHOWN IN FIG. 3

OUTPUT VOLTAGE / FREQUENCY CHARACTERISTIC OF PIEZOELECTRIC TRANSFORMER SHOWN IN FIG. 2

OPERATION WAVEFORM OF POWER SUPPLY DEVICE SHOWN IN FIG. 2

FLOW CHART SHOWING INPUT/OUTPUT RELATIONSHIP IN FIG. 6

FLOW CHART SHOWING INPUT / OUTPUT RELATIONSHIP IN FIG. 6

FLOW CHART SHOWING INPUT / OUTPUT RELATIONSHIP IN FIG. 12

OPERATION WAVEFORM OF POWER SUPPLY DEVICE SHOWN IN FIG. 11

POWER SUPPLY DEVICE AND IMAGE FORMING APPARATUS

CROSS REFERENCE TO RELATED APPLICATION

This application claims priority based on 35 USC 119 from prior Japanese Patent Application No. 2009-030081 filed on Feb. 12, 2009, entitled "POWER SUPPLY DEVICE AND IMAGE FORMING APPARATUS", the entire contents of which are incorporated herein by reference.

BACKGROUND OF THE INVENTION

1. Field of the Invention

The invention relates to a power supply device which uses a piezoelectric transformer, and an electrophotographic or other type of image forming apparatus which uses the power supply device 2. Description of the Related Art A conventional power supply device used for an electrophotographic image forming apparatus has been known (for example, Japanese Patent Application Publication No. 2006-91757), in which an output signal of a voltage-controlled oscillator (hereinafter referred to as "VCO") controls a piezoelectric transformer capable of transforming low voltage input to a high voltage by using a resonance phenomenon of a piezoelectric vibrator thereby outputting the high voltage.

SUMMARY OF THE INVENTION

Such conventional power supply device, however, has the following problems (a) to (d).

(a) Since the power supply device comprises analog circuits such as a VCO, the number of components tends to be large.

(b) Even though a high output voltage near the resonance frequency of a piezoelectric transformer is used, the output voltage may decrease due to load fluctuation. In this case, the piezoelectric transformer is controlled at a drive frequency lower than the resonance frequency, and thereby does not allow the control of the output voltage. For this reason, high voltage output near the resonance frequency cannot be practically used.

(c) Time constants for control need to be determined according to component constants. This causes a problem that if rise time is given priority, control function near the resonance frequency deteriorates, whereas if the control function near the resonance frequency is given priority, the rise time increases.

(d) In a circuit configuration including an analog oscillator such as a VCO, a low control target voltage makes it difficult to control the voltage due to the influence of spurious frequencies.

An first aspect of the invention is a power supply device including: an oscillator configured to output a clock signal; a pulse output unit configured to output a pulse by dividing the frequency of the clock signal in accordance with a control signal; a switching element driven by the pulse; a piezoelectric transformer configured to output a high alternating current voltage from the secondary side thereof when a voltage is intermittently applied to the primary side thereof by the switching element; a rectifier configured to convert the high alternating current voltage to a high direct current voltage; an output voltage conversion unit configured to convert the high direct current voltage to a low direct current voltage; a target setter configured to set and output a target value; and a comparison unit configured to compare the low direct current voltage with the target value and to output a comparison result. In the power supply device, a frequency division ratio of the pulse is controlled according to the comparison result, and thereby is changed so as to obtain the target value.

A second aspect of the invention is an image forming apparatus including the power supply device.

According to the power supply device and the image forming apparatus, a comparison unit compares a target value and a low DC voltage provided by an output voltage conversion unit at the secondary side of a piezoelectric transformer; and a frequency division ratio of pulses is controlled according to the comparison result, and thereby is changed so as to obtain the target voltage. Thus, over a range from a low high-voltage output to a high high-voltage output near the resonance frequency of the piezoelectric transformer, both quick rise time and constant voltage control are achieved. Moreover, since a wide range of voltage output can be obtained, a stable output is achieved regardless of the environment, and further, the image forming apparatus can provide a stable image without non-uniform density and a horizontal stripe. In addition, since the device can be implemented by digital circuits, the number of components may be substantially reduced.

DETAILED DESCRIPTION OF EMBODIMENTS

Figure 1:
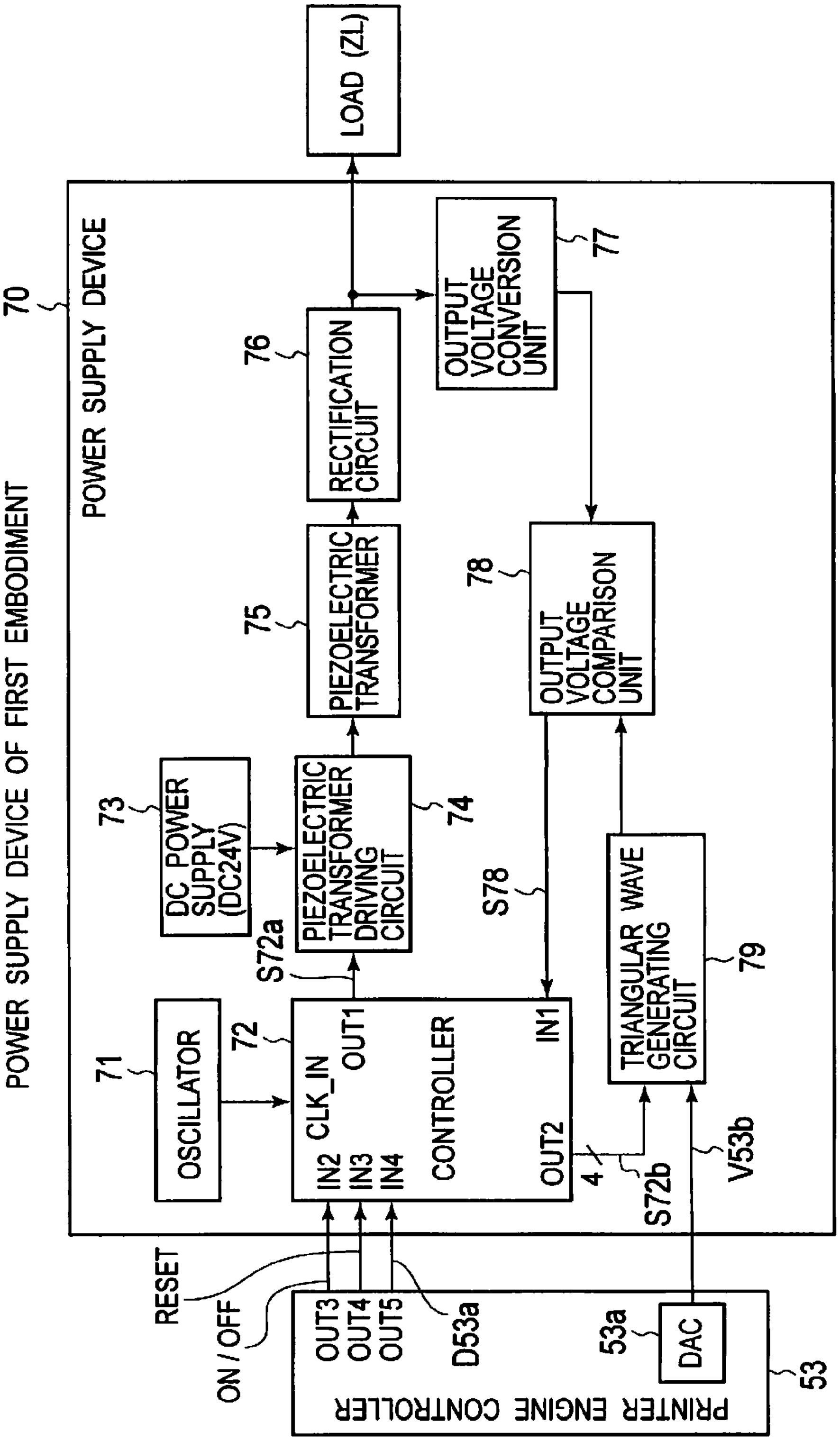
FIG. 1 is a block diagram schematically showing a power supply device according to a first embodiment of the invention.

Descriptions are provided herein below for embodiments based on the drawings. In the respective drawings referenced herein, the same constituents are designated by the same reference numerals and duplicate explanation concerning the same constituents is omitted. All of the drawings are provided to illustrate the respective examples only.

First Embodiment

Configuration of Image Forming Apparatus

Figure 3:
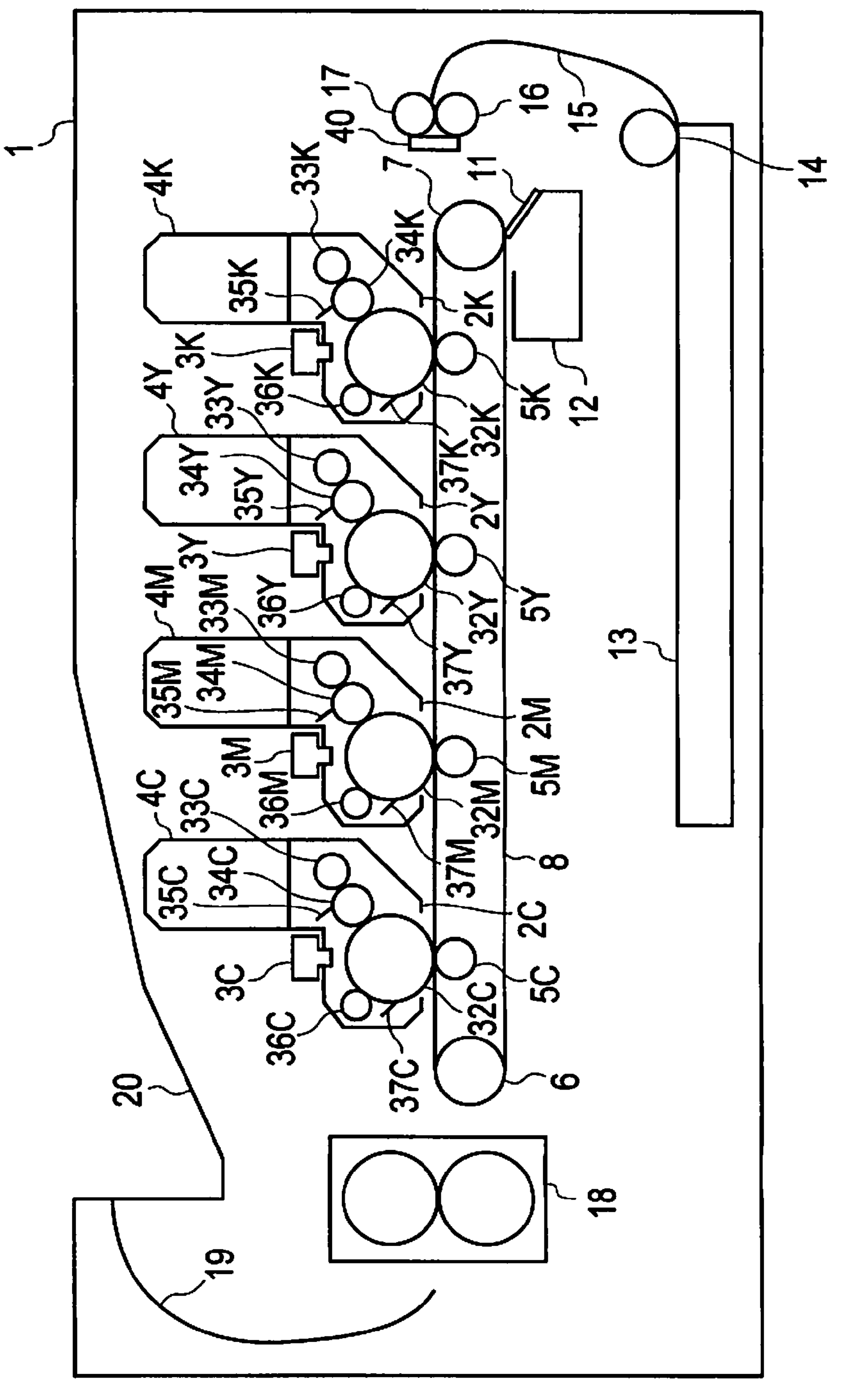
FIG. 3 is a configuration diagram showing image forming apparatus 1 using the power supply device in the first embodiment.

FIG. 3 is a configuration diagram showing an image forming apparatus using a power supply device in the first embodiment of the invention.

Image forming apparatus 1 is a color electrophotographic image forming apparatus in this embodiment. Image forming apparatus 1 includes a printer engine which includes developing units 2K, 2Y, 2M, and 2C, image transfer unit (image transfer rollers 5K, 5Y, 5M, 5C, image transfer belt driving roller 6, image transfer belt driven roller 7, image transfer belt 8), fixing unit 18, paper cassette 13, hopping roller 14, and resist rollers 16 and 17. Developing unit 2K for black toner, developing unit 2Y for yellow toner, developing unit 2M for magenta toner, and developing unit 2C for cyan toner are detachably attached to the body of image forming apparatus 1. Developing units 2K, 2Y, 2M, and 2C respectively include photosensitive drums 32K, 32Y, 32M, and 32C, charging rollers 36K, 36Y, 36M, and 36C, supplying rollers 33K, 33Y, 33M, and 33C, developing rollers 34K, 34Y, 34M, and 34C, development blades 35K, 35Y, 35M, and 35C, and cleaning blades 37K, 37Y, 37M, and 37C. Photosensitive drums 32K, 32Y, 32M, and 32C are in contact with charging rollers 36K, 36Y, 36M, and 36C respectively such that photosensitive drums 32K, 32Y, 32M, and 32C are uniformly charged by charging rollers 36K, 36Y, 36M, and 36C. Light emitting element (hereinafter "LED") head 3K for black image, LED head 3Y for yellow image, LED head 3M for magenta image, and LED head 3C for cyan image emit light onto charged photosensitive drums 32K, 32Y, 32M, and 32C, respectively, so that latent images are formed on charged photosensitive drums 32K, 32Y, 32M, and 32C, respectively.

Supplying rollers 33K, 33Y, 33M, 33C supply toner to developing rollers 34K, 34Y, 34M, and 34C, respectively. The respective color toners supplied to developing rollers 34K, 34Y, 34M, and 34C are metered by development blades 35K, 35Y, 35M, and 35C, respectively, thereby forming uniform thickness toner layers on developing rollers 34K, 34Y, 34M, and 34C. The toner layers on developing rollers 34K, 34Y, 34M, and 34C are electrostatically attracted to the latent images formed on photosensitive drums 32K, 32Y, 32M, and 32C, so as to develop the latent images, that is, form respective color toner images on photosensitive drums 32K, 32Y, 32M, and 32C. The respective color toner images are transferred to a paper sheet by an image transfer unit (5K, 5Y, 5M, 5C, 6, and 7) thereby forming a multi-color toner image on the paper sheet. After transfer of the toner images from photosensitive drums 32K, 32Y, 32M, and 32C to the paper sheet, cleaning blades 37K, 37Y, 37M, and 37C remove any toner remaining on photosensitive drums 32K, 32Y, 32M, and 32C.

Black toner cartridge 4K, yellow toner cartridge 4Y, magenta toner cartridge 4M, and cyan toner cartridge 4C are detachably mounted to developing unit 2K, 2Y, 2M, and 2C, respectively, such that the toner contained in toner cartridges 4K, 4Y, 4M, and 4C can be supplied to developing units 2K, 2Y, 2M, and 2C, respectively. Image transfer roller 5K for a black toner image, image transfer roller 5Y for a yellow toner image, image transfer roller 5M for a magenta toner image, and transfer roller 5C for a cyan toner image are disposed inside transfer belt 8 such that transfer rollers 5K, 5Y, 5M, and 5C apply bias voltages to the transfer nips between the outside of transfer belt 8 and photosensitive drums 32K, 32Y, 32M, and 32C. Image transfer belt driving roller 6 and image transfer belt driven roller 7 support image transfer belt 8 extending there-between such that these rollers 6 and 7 drive image transfer belt 8 to rotate for conveying paper sheet 15 on image transfer belt 8.

Image transfer belt cleaning blade 11 scraps any toner remaining on image transfer belt 8 and the scraped toner is accumulated in image transfer belt cleaner container 12. Paper cassette 13 is detachably mounted to image forming apparatus 1 and is capable of stacking paper sheets 15 serving as a printable medium therein. Hopping roller 14 conveys paper sheets 15 from paper cassette 13 to resist rollers 16 and 17. Resist rollers 16 and 17 convey paper sheet 15 to image transfer belt 8 at the appropriate time. Fixing unit 18 fixes the toner image to the paper sheet 15 by heating and pressing the toner image. The printed-paper sheet is discharged along paper sheet guide 19 to discharge tray 20 such that the printed side of the paper sheet faces downward in discharge tray 20.

Sheet detection sensor 40 is provided near resist rollers 16 and 17. Sheet detection sensor 40 is configured to detect when sheet 15 passes, by a contact or non-contact method. Timing of when the power supply devices apply transfer bias voltages to transfer rollers 5K, 5Y, 5M, and 5C so as to transfer images are determined by time periods that are calculated from the relationships between the sheet conveyance speed and the distances from the sensor position to the respective transfer nips.

Figure 4:
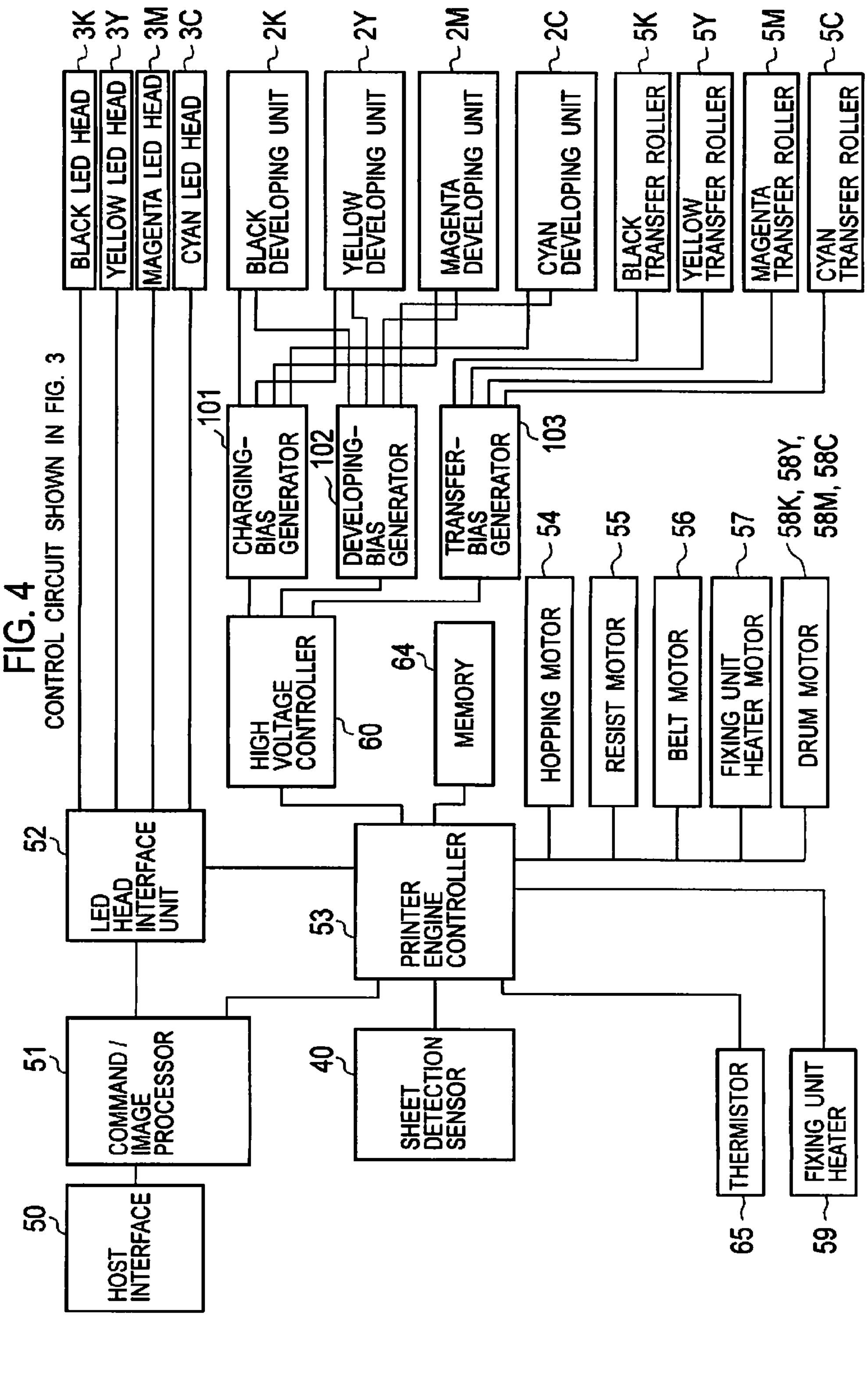
FIG. 4 is a block diagram showing a configuration of the control circuit in image forming apparatus 1 shown in FIG. 3.

FIG. 4 is a block diagram showing a configuration of a control circuit in image forming apparatus 1 in FIG. 3.

This control circuit has host interface 50, which is configured to transmit and receive data to and from command/image processing unit 51. Command/image processing unit 51 is configured to output image data to LED head interface unit 52. LED head interface unit 52 is controlled by printer engine controller 53 and outputs LED head driving pulses and the like thereby causing LED heads 3K, 3Y, 3M, and 3C to emit light.

Printer engine controller 53 is configured to receive detection signals from sheet detection sensor 40, and to transmit control values such as a charging bias, a developing bias, and a transfer bias to high voltage controller 60. High voltage controller 60 is configured to transmit signals to charging-bias generator 101, developing-bias generator 102, and transfer-bias generator 103. Charging-bias generator 101 is configured to apply biases respectively to charging rollers 36K, 36Y, 36M, and 36C, and developing-bias generator 102 is configured to apply biases respectively to developing rollers 34K, 34Y, 34M, and 34C, both rollers in black developing unit 2K, yellow developing unit 2Y, magenta developing unit 2M, and cyan developing unit 2C, respectively. The control circuit in high voltage controller 60 and transfer-bias generator 103 comprise the power supply device of the first embodiment.

Printer engine controller 53 drives hopping motor 54, resist motor 55, belt motor 56, fixing unit heater motor 57, and drum motors 58K, 58Y, 58M, and 58C at predetermined times. Printer engine controller 53 in accordance with a value detected by thermistor 65 controls the temperature of fixing unit heater 59.

(Configuration of Power Supply Device)

FIG. 1 is a block diagram schematically showing the power supply device according to the first embodiment of the invention.

Power supply device 70 is comprises the control circuit in high voltage controller 60 and transfer bias generator 103 in FIG. 4, and is provided for each of transfer rollers 5 of the color toners (5K, 5Y, 5M, and 5C). Since power supply devices 70 of the colors have the same circuit configuration, only one circuit is described below.

Power supply device 70 is configured to receive control signals (e.g., ON/OFF signal, and reset signal RESET) output from printer engine controller 53 and a target value of high voltage output, e.g., a digital preset value D53*a* of 9 bits set by digital/analog converter (hereinafter referred to as "DAC"), and 9-bit target voltage V53*a* to be outputted in a range of 3.3V, and to generate a direct current (hereinafter referred to as "DC") high voltage and supply it to load ZL which is transfer roller 5. Printer engine controller 53 includes: variable voltage output circuit (e.g., a DAC with 9 bit resolution) 53*a* which serves as a target setter for outputting DAC preset value D53*a* and target voltage V53*a*; output port OUT3 for outputting an ON/OFF signal; output port OUT4 for outputting reset signal RESET; and output port OUT5 for outputting DAC preset value D53*a*.

Power supply device 70 includes oscillator 71 configured to generate a reference clock signal (hereinafter referred to as simply "clock") CLK with a constant frequency (e.g., 33.33 MHz). The output side of oscillator 71 is connected to pulse output unit (e.g., controller) 72. Controller 72 is a circuit configured to output piezoelectric transformer drive pulse (hereinafter referred to as simply "drive pulse") S72 by dividing the frequency of clock CLK supplied from oscillator 71 in accordance with control signals (e.g., ON/OFF signal, reset signal RESET, and DAC preset value D53*a*) supplied from printer engine controller 53. That is, controller 72 is a circuit which is, for example, arranged in high voltage controller 60, operates in synchronization with clock CLK supplied from oscillator 71, and outputs drive pulse S72*a* under the control of printer engine controller 53.

Controller 72 includes: input port CLK_IN for receiving clock CLK; input port IN1 for receiving comparison result S78; input port IN2 for receiving the ON/OFF signal; input port IN3 for receiving reset signal RESET; input port IN4 for receiving DAC preset value D53*a*; output port OUT1 for outputting drive pulse S72*a*; and output port OUT2 for outputting 4-bit TTL signal 572*b* used to generate a triangular wave. Controller 72 controls ON/OFF of drive pulse S72*a* output from output port OUT1, in accordance with the input ON/OFF signal. The controller 72 also initializes an output setting for output port OUT1 in accordance with input reset signal RESET.

It is also possible to omit input of reset signal RESET to input port IN3 by inputting a combination signal of ON/RESET instead of inputting the ON/OFF signal from input port IN2. Moreover, in the first embodiment, 9-bit DAC 53*a* is provided in printer engine controller 53, but it is also possible to provide the DAC in controller 72 to make the 9-bit signal serve as an internal signal in controller 72.

For example, controller 72 comprises: an application specific integrated circuit (hereinafter referred to as "ASIC"), which is an integrated circuit in which various function circuits are integrated into a single circuit for specific applications; a microprocessor including therein a central processing unit (hereinafter referred to as "CPU"); a field programmable gate array (hereinafter referred to as "FPGA"), which is a type of gate array in which the user can write his/her original logic; or the like.

Output port OUT1 of controller 72 and DC power supply 73 configured to output DC 24V are connected to piezoelectric transformer driving circuit 74. Piezoelectric transformer driving circuit 74 is a circuit configured to output a drive voltage using a switching element, and the output side of piezoelectric transformer driving circuit 74 is connected to piezoelectric transformer 75. Piezoelectric transformer 75 is a transformer configured to output a high voltage of alternating current (hereinafter referred to as "AC") by increasing the drive voltage using the resonance of a piezoelectric vibrator of a ceramic or the like, and the output side of piezoelectric transformer 75 is connected to rectifier (e.g., rectification circuit) 76. Rectification circuit 76 is configured to convert the high AC voltage output from piezoelectric transformer 75 into a high DC voltage and then to supply it to load ZL, and the output side of rectification circuit 76 is connected to output voltage conversion unit 77.

Output voltage conversion unit 77 is a circuit configured to convert a high DC voltage to a low voltage, and the output side thereof is connected to controller 72 and triangular wave generating circuit 79 via output voltage comparison unit 78, or a comparison unit. Output voltage comparison unit 78 is configured to compare the low DC voltage output from output voltage conversion unit 77 with the voltage of a triangular wave output from triangular wave generating circuit 79, and input comparison result S78 to input port IN1 of controller 72. Triangular wave generating circuit 79 is controlled by 4-bit TTL signal S72*b* output from output port OUT2 of controller 72 and is also configured to generate a triangular wave having a peak voltage twice that of target voltage V53*a* output from DAC 53*a* in printer engine controller 53 and to supply the triangular wave to output voltage comparison unit 78.

Power supply device 70 in FIG. 1 is provided for each of transfer rollers 5 of the colors (5K, 5Y, 5M, 5C), i.e., aligned for each channel, and part of power supply device 70 may be shared by these multiple channels. For example, although piezoelectric transformer 75, rectification circuit 76, and the like are each needed for each of the multiple channels, the single set of oscillator 71 and controller 72 may be shared by the channels. In this case, controller 72 is provided with as many input/output ports as needed for the channels. Moreover, controller 72 is provided in power supply device 70 in the first embodiment, but may be provided in a large scale integrated circuit (hereinafter referred to as "LSI") in printer engine controller 53.

Figure 2:
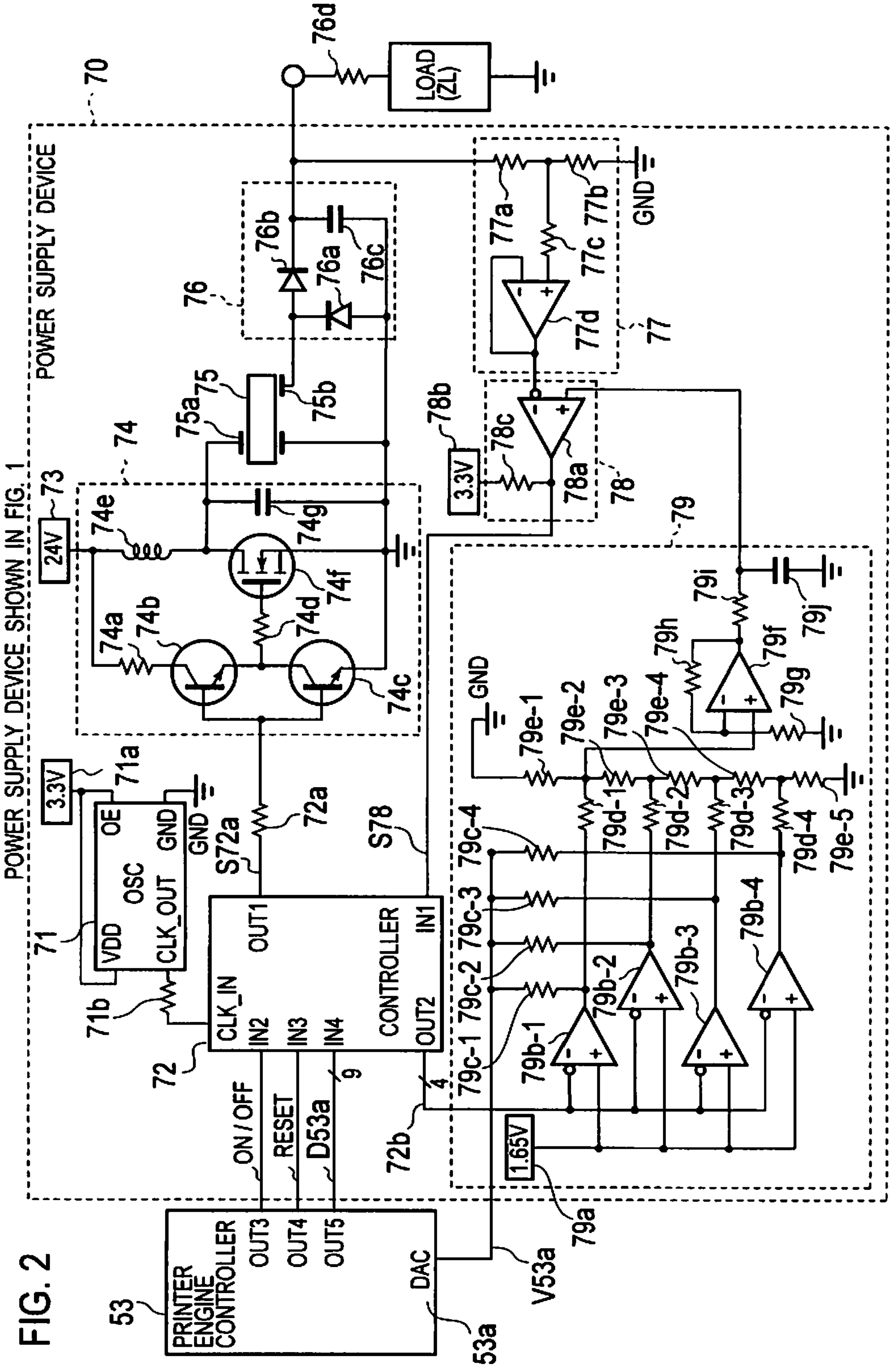
FIG. 2 is a circuit diagram showing a detailed configuration example of power supply device 70 in FIG. 1.
Figure 5:
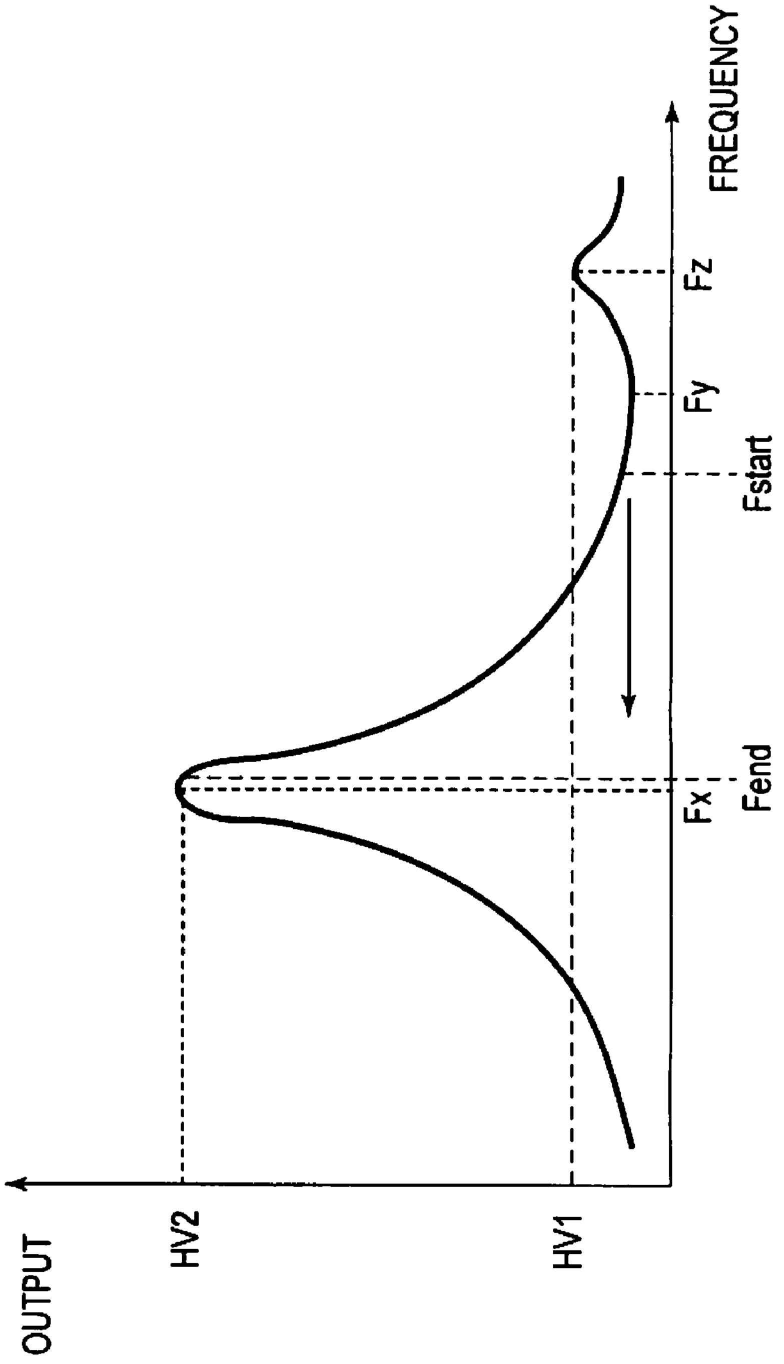
FIG. 5 is a characteristic graph of the output voltage versus the frequency in piezoelectric transformer 75 in FIG. 2.

FIG. 2 is a circuit diagram showing a detailed configuration example of power supply device 70 in FIG. 1. FIG. 5 is a characteristic graph of the output voltage versus frequency in piezoelectric transformer 75 in FIG. 2.

Oscillator 71 is a circuit configured to operate with DC 3.3V supplied from power supply 71*a* and to generate clock CLK with an oscillation frequency of 33.33 MHz. Oscillator 71 includes: power supply terminal VDD to which DC 3.3V is applied; output enable terminal OE to which DC 3.3V is applied; clock output terminal CLK_OUT from which clock CLK is output; and ground terminal GND. Clock output terminal CLK_OUT is connected to input port CLK_IN of controller 72 via resistor 71*b*.

In controller 72, which operates in synchronization with clock CLK, output port OUT 1 for outputting drive pulse S72*a* is connected to piezoelectric transformer driving circuit 74 via resistor 72*a*, and DC power supply 73 is connected to piezoelectric transformer driving circuit 74. DC power supply 73 is, for example, a DC 24V power supply which is supplied from an unillustrated low voltage power supply device by transforming and rectifying a commercial power supply of AC 100 V.

Piezoelectric transformer driving circuit 74 is comprised of: a gate driving circuit configured such that NPN transistor 74*b* and PNP transistor 74*c* receive drive pulse S72*a* from controller 72, and are supplied with 24V via resistor 74*a*; input resistor 74*d*; inductor (coil) 74*e* and capacitor 74*g* which form a resonance circuit; and switching element (e.g. N-channel power MOSFET, hereinafter referred to as "NMOS") 74*f*. Piezoelectric transformer driving circuit 74 is configured such that when the pulse is input to the gate of NMOS74*f* via input resistor 74*d* and the gate driving circuit including transistors 74*b* and 74*c*, switching is performed for DC 24V of DC power supply 73 by NMOS74*f*, and the DC 24V is resonated by the resonance circuit including inductor 74*e* and capacitor 74*g*, whereby a drive voltage with a sine wave whose peak voltage is approximately AC 100V is output.

The resonant circuit is configured such that the output side thereof is connected to the primary side input terminal 75*a* of piezoelectric transformer 75, and from the secondary side output terminal 75*b* of piezoelectric transformer 75, a high AC voltage of 0 to several KV is output according to the switching frequency of NMOS74*f*. The output voltage characteristic at the secondary side output terminal 75*b* varies depending on the frequency as shown in FIG. 5, and the voltage increase ratio is determined by the switching frequency of NMOS74*f*. As shown in FIG. 5, piezoelectric transformer 75 has the highest voltage increase ratio at frequency Fx, and the lowest voltage increase ratio near frequency fy. Frequency Fz represents a spurious frequency. The first embodiment is configured to control the switching frequency in a range from Fstart to Fend where Fstart is lower than spurious frequency Fz and Fend is higher than resonance frequency Fx.

Secondary side output terminal 75*b* of piezoelectric transformer 75 is connected to rectifier (e.g., rectification circuit for AC/DC conversion) 76. Rectification circuit 76 is configured to convert the high AC voltage output from secondary side output terminal 75*b* of piezoelectric transformer 75 into a high DC voltage and to output the high DC voltage. Rectification circuit 76 is comprised of diodes 76*a*, 76*b* and capacitor 76*c*. The output side of rectification circuit 76 is connected to transfer roller 5, which is load ZL, via resistor 76*d* as well as to output voltage conversion unit 77.

Output voltage conversion unit 77 is comprised of: voltage dividing resistors 77*a* and 77*b* configured to divide the high DC voltage of rectification circuit 76 and convert the high DC voltage into a low voltage (e.g., a low voltage not more than DC 3.3V); and a voltage follower circuit including operational amplifier (hereinafter referred to as "op-amp") 77*d* configured to receive the low voltage via protective resistor 77*c*. For example, in output voltage conversion unit 77, voltage dividing resistors 77*a* and 77*b* have resistance values of 200 MΩ and 100 KΩ, respectively, and thus the high DC voltage output from rectification circuit 76 is reduced to 1/2001 of the original voltage. DC 24V is applied to op-amp 77*d* from DC power supply 73, and the output side of the voltage follower circuit including op-amp 77*d* is connected to output voltage comparison unit 78.

Output voltage comparison unit 78 is comprised of: comparator 78*a* serving as a voltage comparator to which DC 24V is applied from DC power supply 73; and DC 3.3V power supply 78*b* as well as pull-up resistor 78*c* configured to pull up the output terminal of comparator 78*a*. Comparator 78*a* is a circuit comprising: a "−" input terminal configured to receive an output voltage of the voltage follower circuit; and a "+" input terminal configured to receive a triangular wave voltage output from triangular wave generating circuit 79. Comparator 78*a* is configured to compare the voltage at the "−" input terminal with the voltage at the "+" input terminal and output comparison result S78 from its output terminal to input port IN1 of controller 72. The output terminal of comparator 78*a* is connected to DC 3.3V power supply 78*b* via pull-up resistor 78*c*.

When a triangular wave voltage output from triangular wave generating circuit 79 is input to the "+" input terminal of comparator 78*a*, comparator 78*a* compares the output voltage of output voltage conversion unit 77 with the output voltage of triangular wave generating circuit 79.

While (the output voltage of triangular wave generating circuit 79)>(the output voltage of output voltage conversion unit 77), the output terminal of comparator 78*a* is pulled up to DC 3.3V (=high level, hereinafter referred to as "H") by DC 3.3V power supply 78*b* and resistor 78*c*. The "H" is input to input port IN1 of controller 72. On the other hand, while (the output voltage of triangular wave generating circuit 79)<(the output voltage of output voltage conversion unit 77), the output terminal of comparator 78*a* is set to a low level (hereinafter referred to as "L"). The "L" is input to input port IN1 of controller 72.

Triangular wave generating circuit 79 is comprised of: DC 1.65V power supply 79*a* obtained from DC 3.3V power supply 71*a* by voltage division or the like; four comparators 79*b*-1 to 79*b*-4; four resistors 79*c*-1 to 79*c*-4 for pull-up; four resistors 79*d*-1 to 79*d*-4; five voltage dividing resistors 79*e*-1 to 79*e*-5; op-amp 79*f*; input resistor 79*g*; feedback resistor 79 *h*; and a RC filter including resistor 79*i* and capacitor 79*j*. All of four resistors 79*d*-1 to 79*d*-4 have the same resistance value, and all of five resistors 79*e*-1 to 79*e*-5 also have the same resistance value, which is one-half the resistance of 79*d*-1. Resistors 79*c*-1 to 79*c*-4 each has a resistance lower than those of 79*d*-1 to 79*d*-4.

A DAC of the R-2R type is comprised of resistors 79*d*-1 to 79*d*-4 and voltage dividing resistors 79*e*-1 to 79*e*-5. A triangular wave voltage is generated by changing the digital values of TTL signal S72*b* output from output port OUT2 of controller 72, for example, from 0000b to 1111b to 0000b. TTL signal S72*b* is compared with DC 1.65V of power supply 79*a* by comparator 79*b*-1 to 79*b*-4, and is converted into a R-2R output voltage based on 9-bit 3.3V target voltage V53*a* output from DAC53*a*. The R-2R output voltage is input to op-amp 79*f*, and is amplified by an amount determined by resistors 79*g* and 79*h*. The amplified voltage is filtered through the RC filter including resistor 79*i* and capacitor 79*j* and a triangular wave voltage whose peak voltage is twice as much as target voltage V53*a* is output.

(Configuration of Controller in Power Supply Device)

Figure 6:
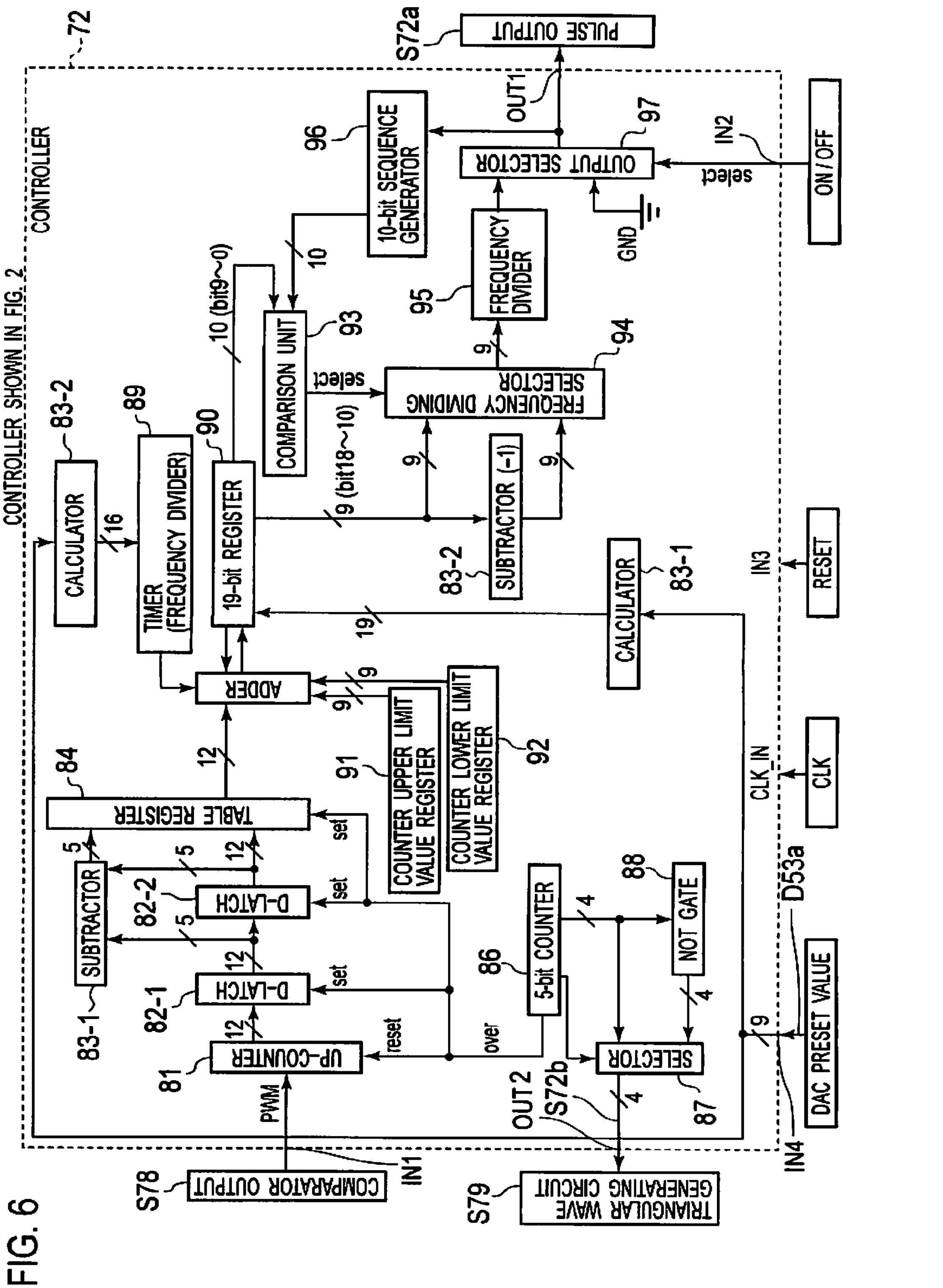
FIG. 6 is a configuration diagram showing controller 72 shown in FIG. 2.

FIG. 6 is a configuration diagram showing controller 72 in FIG. 2.

Controller 72 is an ASIC described by a hardware description language or the like. Clock CLK and reset signal RESET are input to controller 72. Clock CLK is supplied to each circuit block constituting a synchronous circuit, which is described below, and reset signal RESET is supplied to each circuit block for its initialization.

Controller 72 includes up-counter 81 connected to input port IN1, and further connected to data latch (hereinafter referred to as "D-latch") 82-1 and 5-bit counter 86. Up-counter 81 is a 12-bit counter configured to count up "H" of comparison result S78 output from comparator 78*a*, with a rise pulse of clock CLK. Up-counter 81 does not count up while comparison result S78 is "L", but counts up only when comparison result S78 is "H." Moreover, up-counter 81 functions in such a way that it is reset to zero by an overflow signal OVER from 5-bit counter 86, is cleared to zero by input of "L" of reset signal RESET, and disables the count up while "L" is held. The 12-bit signal of up-counter 81 is output to D-latch 82-1 in the next stage.

D-latch 82-1 is a circuit configured to hold the 12-bit signal of up-counter 81 when receiving overflow signal OVER output from 5-bit counter 86, and to output the held 12-bit signal to subtractor 83-1 and D-latch 82-2. The 12-bit signal value is cleared to 0 by "L" of reset signal RESET. D-latch 82-2 is a circuit configured to hold the output signal of D-latch 82-1 at an output time of overflow signal OVER of 5-bit counter 86, and to output the signal value to subtractor 83-1 and table register 84. Subtractor 83-1 is configured to subtract the upper 5-bit value of D-latch 82-2 from the upper 5-bit value of D-latch 82-1, and to output the resulting 5-bit value to table register 84.

Table register 84 is configured to output a 12-bit value, whose uppermost bit is a sign bit, to adder 85 by referencing a table with the 5-bit value of subtractor 83-1 and the 12-bit value of D-latch 82-2. Adder 85 is configured to function in the following way. Adder 85 adds the value of table register 84 to the lower 11-bit value of the value of 19-bit register 90, and compares the upper 9 bits of the 19 bits obtained by the sum with counter upper limit value register 91 and counter lower limit value register 92. If the upper 9 bits are greater than the value of counter upper limit value register 91, adder 85 sets the value of counter upper limit value register 91 as the upper 9 bits, whereas if the upper 9 bits are lower than counter lower limit value register 92, adder 85 sets the value of counter lower limit value register 92 as the upper 9 bits. Then adder 85 sets the 19 bits obtained by the sum as 19-bit register 90. Adder 85 performs the above operation in synchronization with the rising edges of pulses input from timer (frequency divider) 89 at a constant cycle.

5-bit counter 86 is configured to count up every 128 clock pulses of clock CLK with 33.33 MHz (30 nsec cycle), i.e., count up every 3.84 μsec, and is connected to selector 87 and negation gate (hereinafter referred to as "NOT gate") 88. 5-bit counter 86 is configured to output overflow signal OVER to up-counter 81, D-latches 82-1, 82-2, and table register 84 when its 5-bit count value changes from 11111b to 00000b. Also, the lower 4-bit value of the 5-bit value of 5-bit counter 86 is input to selector 87 and NOT gate 88, and the signal inverted by going through NOT gate 88 is input to selector 87. The uppermost bit value of 5-bit counter 86 is input to selector 87, and the lower 4-bit value of 5-bit counter 86 and the inverted value thereof are output to triangular wave generating circuit 79.

DAC preset value D53*a* input to input port IN4 is 9-bit data, and is further input to calculators 83-1 and 83-2. Calculator 83-1 is configured to set an initial value of 19 bits in accordance with the 9-bit value of DAC preset value D53*a*, when reset signal RESET is input to 19-bit register 90. Calculator 83-2 is configured set a count cycle of timer (frequency divider) 89 in 16 bits in accordance with the 9-bit value of DAC preset value D53*a*. 19-bit register 90 has its initial value set by calculator 83-1, and is periodically updated by adder 85. 19-bit register 90 sets its upper 9 bits to frequency dividing selector 94, and outputs its lower 10 bits to comparison unit 93. Also, 19-bit register 90 has a function to output its upper 9 bits to subtractor 83-2.

Subtractor 83-2 is configured to subtract 1 from the upper 9 bits of 19-bit register 90, and to output the resulting 9-bit value to frequency dividing selector 94, which is connected to comparison unit 93. Comparison unit 93 is configured to compare the lower 10 bits value of 19-bit register 90 with the 10-bit value of 10-bit sequence generator 96, and to output selection signal SELECT to frequency dividing selector 94. Frequency dividing selector 94 is configured to output the 9-bit value of either 19-bit register 90 or subtractor 83-2 to frequency divider 95 in accordance with selection signal SELECT output from comparison unit 93.

Frequency divider 95 is configured to output a pulse with 30% duty to output selector 97 at the cycle of 9-bit value output from frequency dividing selector 94. Upon receipt of an ON/OFF signal as selection signal SELECT, output selector 97 outputs a pulse as drive pulse S72*a* from frequency divider 95 to piezoelectric transformer 74 in accordance with selection signal SELECT.

To be more precise, frequency divider 95 is provided with a 9-bit counter configured to count up at a rise of clock CLK, and to compare the 9-bit output value from frequency dividing selector 94 as well as approximately 30% of the 9-bit output value with the 9-bit count value where 30% of the 9-bit output value is the sum of ¼, 1⁄32, and 1⁄64 of the 9-bit output value, that is, the sum of 2-bit, 5-bit, and 6-bit right shifted 9-bit output value from frequency dividing selector 94. Frequency divider 95 outputs "L" if the 9-bit count value reaches approximately 30% of the output value from frequency dividing selector 94, and outputs "H" if the 9-bit count value reaches the output value, and then resets the internal counter to 0.

10-bit sequence generator 96 connected to the output side of output selector 97 is a 10-bit counter circuit configured to count a rising edge of drive pulse S72*a* output from output selector 97, and to reverse the order of the bits of 10-bit count value from the uppermost bit to the lowermost bit, and to then outputs the reversed bits to comparison unit 93.

(Operation of Image Forming Apparatus)

In FIGS. 3 and 4, image forming apparatus 1 receives print data described by a page description language (PDL) or the like from an unillustrated external device via host interface 50. The print data is converted into bit map data (image data) by command/image processing unit 51, and is sent to LED head interface unit 52 and printer engine controller 53. Printer engine controller 53 controls heater 59 in fixing unit 18 in accordance with a detected value of thermistor 65 so that the heat fixing rollers in fixing unit 18 are each heated up to a predetermined temperature. Then, printing operation is started.

Sheet 15 in sheet feed cassette 13 is fed by hopping roller 14. Sheet 15 is conveyed onto transfer belt 8 by resist rollers 16 and 17 in synchronization with the image forming operation, which is described below. In developing units 2K, 2Y, 2M, and 2C of the color toners, toner images are formed respectively on photosensitive drums 32K, 32Y, 32M, and 32C by an electrophotographic process. At this point, LED heads 3K, 3M, 3Y, and 3C emit light according to the above-mentioned bit map data. The toner images developed by developing units 2K, 2Y, 2M, and 2C of the respective colors are transferred to sheet 15, which is being conveyed on transfer belt 8, by high voltage DC biases applied respectively to transfer rollers 5K, 5Y, 5M, and 5C from power supply device 70. After transferred to sheet 15, the toner images of the 4 colors are fixed to sheet 15 by fixing unit 18 and then discharged.

(Operation of Power Supply Device)

First, the operation of power supply device 70 in FIG. 1 is described.

In the color image apparatus, four outputs are needed for the transfer and four circuits therefor have the same configuration. Thus, only one of the outputs of power supply device 70 is described in the first embodiment.

Target voltage V53*a* is set by 9-bit DAC53*a* provided in printer engine controller 53. For example, if the high DC voltage is 5 kV, target voltage V53*a* should be 2.5V. That is, since DAC53*a* is 9 bit, the value, 388 (or 184H by hexadecimal conversion) is set so that target voltage V53*a* of 2.5V is output from DAC53*a* to triangular wave generating circuit 79. At this point, printer engine controller 53 sets the ON/OFF signal, which is output from output port OUT3 to controller 72, to OFF and also outputs reset signal RESET from output port OUT4 to controller 72 to thereby reset controller 72.

Controller 72 outputs drive pulse S72*a* to piezoelectric transformer driving circuit 74 in accordance with the ON/OFF signal from printer engine controller 53, driving pulse S72*a* being obtained by dividing the frequency of clock CLK output from oscillator 71. Controller 72 changes the frequency division ratio in accordance with comparison result S78 input from output voltage comparison unit 78. Piezoelectric transformer driving circuit 74 uses drive pulse S72*a* to switch DC24V supplied from DC power supply 73 and thereby generates a drive voltage. Piezoelectric transformer driving circuit 74 then supplies the drive voltage to the primary side of piezoelectric transformer 75. Accordingly, the primary side of piezoelectric transformer 75 is driven so that a high AC voltage is output from the secondary side thereof. The high AC voltage is rectified by rectification circuit 76 and the resulting high DC voltage is supplied to load ZL, which is transfer roller 5. Output voltage conversion unit 77 converts the high DC voltage output from rectification circuit 76 into, e.g., 1/2001 of the original voltage, and supplies the converted voltage to output voltage comparison unit 78.

Triangular wave generating circuit 79 receives 4-bit TTL signal S72*b* output from output port OUT2 of controller 72, and target voltage V53*a* of 2.5V output from DAC53*a*, and generates a triangular wave voltage whose amplitude (peak value) is twice that of target voltage V53*a*, by changing the value of 4-bit TTL signal S72*b* in the following sequence, for example: 0000b, 0001b, 0010b, 0011b, 0100b, 0101b, 0110b, 0111b, 1000b, 1001b, 1010, 1011b, 1100b, 1101b, 1110b, 1111b, 1111b, 1110b, 1100b, 1011b, 1010b, 1001b, 1000b, 0111b, 0110b, 0101b, 0100b, 0011b, 0010b, 0001b, 0000b. The generated output voltage is supplied to output voltage comparison unit 78.

Output voltage comparison unit 78 compares the output voltage of output voltage conversion unit 77 with the triangular wave voltage which is output from triangular wave generating circuit 79 and has the amplitude twice as much as target voltage V53*a*. Then, output voltage comparison unit 78 outputs comparison result S78 to input port IN1 of controller 72. When the output voltage of output voltage conversion unit 77 is lower than target voltage V53*a*, output voltage comparison unit 78 generates "H" at a TTL level, while when the output voltage from output voltage conversion unit 77 is higher than target voltage V53*a*, output voltage comparison unit 78 generates "L." Output voltage comparison unit 78 then outputs comparison result S78 related to pulse width modulation (hereinafter referred to as "PWM") waveform of the generation cycle of the triangular wave, to input port IN1 of controller 72. When the output voltage of output voltage conversion unit 77 approaches target voltage V53*a*, the duty of the PWM waveform becomes 50%. According to such comparison result S78, the frequency division ratio of controller 72 is varied.

Although triangular wave generating circuit 79 is used to generate a step-like triangular wave in digital form in the first embodiment, an analog integrating circuit or the like may also be used to implement the invention.

Figure 7:
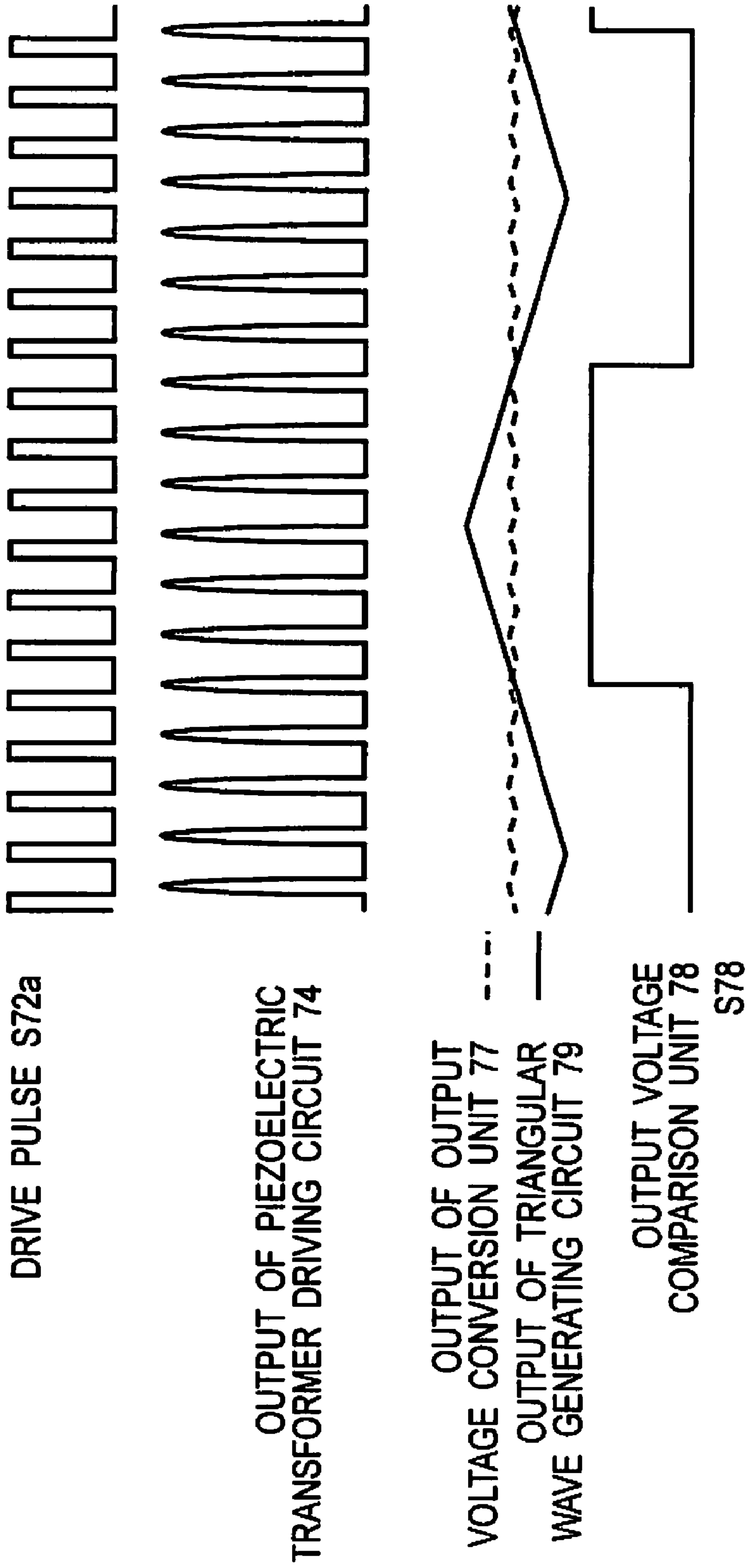
FIG. 7 is a set of operation waveform charts of power supply device 70 in FIG. 2.
Figure 8:
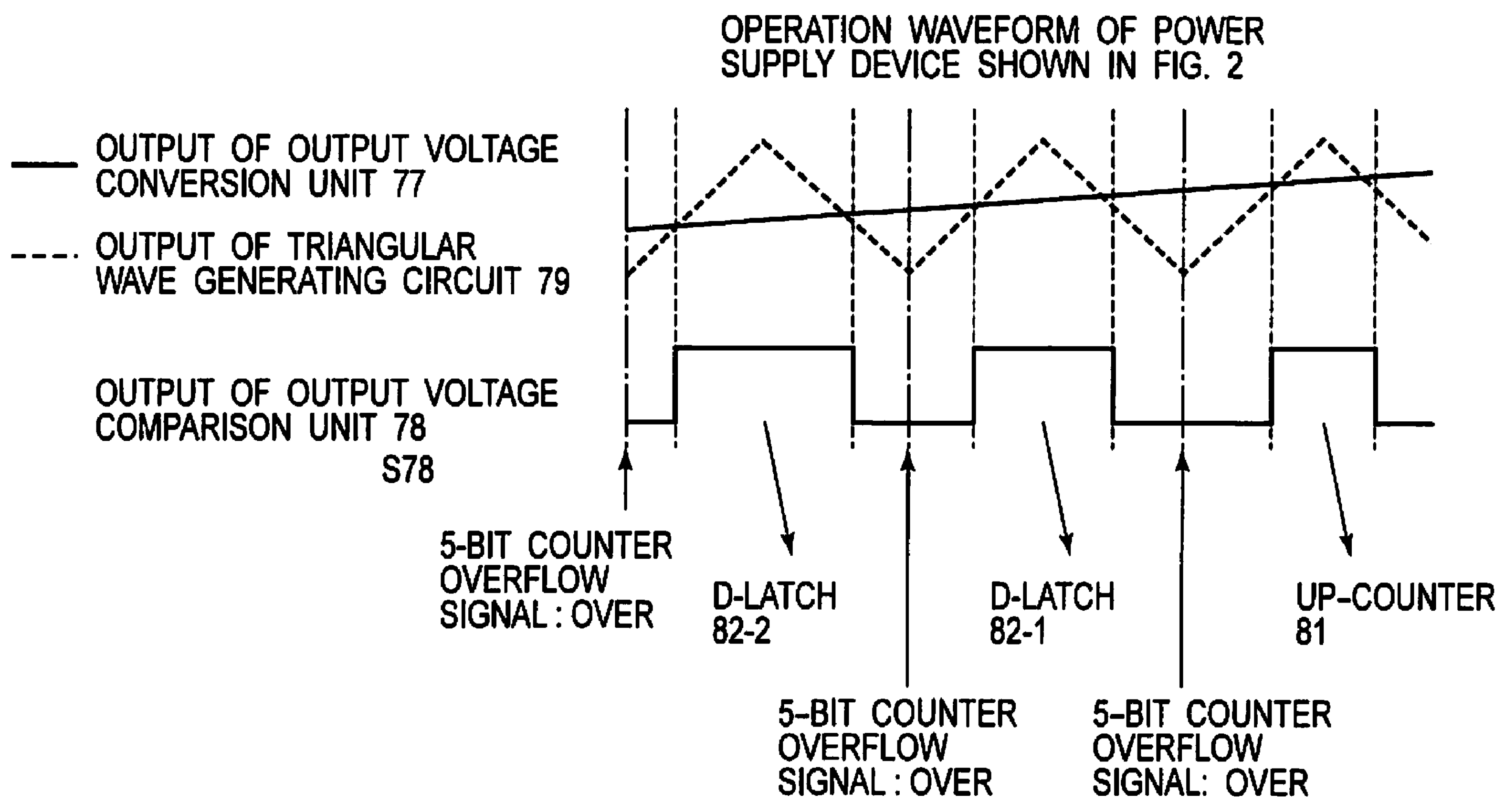
FIG. 8 is a set of operation waveform charts of power supply device 70 in FIG. 2.

FIGS. 7 and 8 are operation waveform charts of power supply device 70 in FIG. 2.

Details of the operation of power supply device 70 in FIG. 2 are described with reference to FIGS. 7 and 8.

Printer engine controller 53 resets various settings for output port OUT1 of controller 72 by setting reset signal RESET, which is to be output from output port OUT4, to "L." This reset signal indicates true when it is "L." The reset operation initializes the values of the frequency division ratio of the output at output port OUT1, and the like.

DAC53*a* in printer engine controller 53 outputs target voltage V53*a* as a target value for a high voltage output. For example, if the high voltage output is 5 kV, printer engine controller 53 outputs 3.229 V. In this case, since DAC53*a* is a 3.3V DAC with 9 bits, 1F4H is set to a given internal register. From output port OUT2, controller 72 outputs, to comparators 79*b*-1 to 79*b*-4 in triangular wave generating circuit 79, the values of 4-bit TTL signal S72*b* (for example, 0000b, 0001b, 0010b, 0011b, 0100b, 0101b, 0110b, 0111b, 1000b, 1001b, 1010b, 1011b, 1100b, 1101b, 1110b, 1111b, 1111b, 1110b, 1101b, 1100b, 1011b, 1010b, 1001b, 1000b, 0110b, 0101b, 0100b, 0011b, 0010b, 0001b, and 0000b). Each of comparators 79*b*-1 to 79*b*-4 compares DC 1.65V of DC power supply 79*a* with the value of 4-bit TTL signal S72*b* and provides an open collector output if TTL signal 72*b* is "H," or outputs "L" if TTL signal 72*b* is "L."

The ratio of the resistance values among resistors 79*c*-1 to 79*c*-4, 79*d*-1 to 79*d*-4, and 79*e*-1 to 79*e*-5 in triangular wave generating circuit 79 is 1:10:5, respectively. When comparators 79*b*-1 to 79*b*-4 have open collector outputs, output terminals of comparators 79*b*-1 to 79*b*-4 are pulled up by target voltage V53*a*, and thus a voltage of approximately 3.115 V is applied to resistors 79*d*-1 to 79*d*-4. When the value of TTL signal S72*b* is 1111b, a voltage of 1.402 V is applied to the "+" input terminal of op-amp 79*f*, and amplified by the gain due to resistors 79*g* and 79*h*, and a voltage of 5.0 V is output from the output terminal of op-amp 79*f*. Since resistors 79*d*-1 to 79*d*-4 and 79*e*-1 to 79*e*-5 constitute a DAC of the R-2R type, a step-like triangular wave is output from op-amp 79*f* by increasing/decreasing the value of TTL signal S72*b*. The output voltage is shaped into a triangular wave by the RC filter including resistor 79*i* and capacitor 79*j*. Since target voltage V53*a* output from DAC53*a* at this point changes every 128 clock cycles (i.e., 3.84 μsec), the cycle of the triangular wave is 122.88 μsec.

After outputting target voltage V53*a* from DAC53*a*, printer engine controller 53 switches reset signal RESET, which is output from output port OUT4, to "H" in order to cancel the reset of controller 72. Once the reset controller 72 is cancelled, controller 72 divides the frequency of clock CLK input as its initial value from input port CLK_IN, with a frequency division ratio of the initial value, ON duty of 30%. Here, while the ON/OFF signal output from output port OUT3 of printer engine controller 53 is "L," frequency-divided drive pulse S72*a* is not output from output port OUT1, and the output from output port OUT1 is held at "L."

Oscillator 71 is connected to input port CLK_IN of controller 72 via resistor 71*b*. Oscillator 71 is supplied with DC 3.3V from power supply 71*a* at power supply terminal VDD and output enable terminal OE, and outputs clock CLK having an oscillating frequency of 33.33 MHz and a cycle of 30 ns from CLK terminal immediately after power supply 71*a* is turned on.

While output port OUT1 of controller 72 is held at "L," NPN transistor 74*b* in piezoelectric transformer driving circuit 74 is OFF, and thus NMOS74*f* is also OFF. Therefore, DC 24V supplied from 24V power supply 73 is directly applied to primary side input terminal 75*a* of piezoelectric transformer 75. In this condition, the electric current value of DC 24V power supply 73 is nearly 0, and vibration of piezoelectric transformer 75 is not present. Thus, secondary output terminal 75*b* of piezoelectric transformer 75 is also 0 V, and the output voltage of op-amp 77*d* in output voltage conversion unit 77 is "L."

In the above-mentioned condition, comparator 78*a* in output voltage comparison unit 78 receives a triangular wave of 0 to 5.0 V at the "+" input terminal thereof, and "L" of op-amp 77*d* at the "−" input terminal thereof. Thus, the output terminal of comparator 78*a* is pulled up to DC 3.3V by power supply 78*b*, and "H" is input to input port IN1 of controller 72.

Next, printer engine controller 53 sets the ON/OFF signal, which is output from output port OUT3, to "H" at a predetermined time, thus bringing the high voltage output into the ON state. When input port IN2 to which the ON/OFF signal is input becomes "H," controller 72 outputs drive pulse S72*a*, which has been frequency-divided with the initial value, from output port OUT1. Switching is performed on NMOS74*f* by drive pulse S72*a* via the gate driving circuit, which includes NPN transistor 74*b* and PNP transistor 74*c* in piezoelectric transformer driving circuit 74, so that a sine pulse with several tens of voltage as shown in FIG. 7 is applied to primary side input terminal 75*a* of piezoelectric transformer 75 by inductor 74*e*, capacitor 74*g*, and piezoelectric transformer 75.

Accordingly, piezoelectric transformer 75 vibrates and thus generates an increased high AC voltage from secondary side output terminal 75*b*. The high AC voltage is rectified by rectification circuit 76 into a DC voltage, which is then divided by resistor 77*a* of 200 MΩ and resistor 77*b* of 100 KΩ in output voltage conversion unit 77. The divided voltage is input to the "−" input terminal of comparator 78*a* in output voltage comparison unit 78 through protective resistor 77*c* and op-amp 77*d*. Comparator 78*a* compares the output voltage of output voltage conversion unit 77 with the output voltage of triangular wave generating circuit 79, which is input to the "+" input terminal. Then, comparator 78*a* outputs comparison result S78 of a rectangular wave at a triangular wave cycle, and inputs comparison result S78 to input port IN1 of controller 72. The ON duty of the rectangular wave in comparison result S78 is 100% at a high voltage output of 0 V, and becomes 50% at 5 kV, which is target voltage V53*a*. Moreover, the ON duty becomes 0% at 10 kV exceeding target voltage V53*a*.

Controller 72 counts a time in which the input level of comparison result S78 input from input-port IN1 is "H" over the output cycle of 4-bit TTL signal S72*b* output from output port OUT2, and controls drive pulse S72*a* output from output port OUT1 so that the above-mentioned duty would become 50%.

(Operation of Controller in Power Supply Device)

Operation of controller 72 shown in FIG. 6 in power supply device 70 is described.

First, reset signal RESET is input from input port IN3 to initialize the count values and the like. When 9-bit DAC preset value D53*a* is input from input port IN4, DAC preset value D53*a* is supplied to calculators 83-1 and 83-2. 9-bit DAC preset value D53*a* is in the range of 0 to 511 corresponding to a high voltage output in the range of 0 to 5110 V. Calculator 83-1 adds the upper 4 bits of 9-bit DAC preset value D53*a* (i.e., 1/32 of the value of target voltage V53*a*) to 275, and sets the sum to counter lower limit value register 92. For example, when target voltage V53*a* is 5 kV, 9-bit DAC preset value D53*a* is 500, and thus a frequency division value of 290 (=275+15) is set to counter lower limit value register 92.

When reset signal RESET changes from "L" to "H," the lower 10 bits of 19-bit register 90 are cleared to 0, and the above-mentioned frequency division ratio (e.g., 290 when target voltage V53*a* is set to 5 kV) output from calculator 83-1 is set to the upper 9 bits. Calculator 83-2 multiplies 9-bit DAC preset value D53*a* by 4, i.e., appends 00b to the lower 2 bits and adds 240 to the resulting 11-bit value. Then, the sum is set to timer (frequency divider) 89. For example, when the target high voltage is set to 5 kV, 9-bit DAC preset value V53*a* is 500, and thus timer (frequency divider) 89 outputs a pulse to adder 85 every 2240 cycles (i.e., 67.2 μsec). Moreover, for example, when the target high voltage is set to 1 kV, 9-bit DAC preset value V53*a* is 100, and thus frequency divider 89 outputs a pulse to adder 85 every 640 cycles (i.e., 19.2 μsec).

5-bit counter 86 is a counter of 5 bits which counts up every 128 cycles of clock CLK, and together with selector 87 and NOT gate 88, outputs TTL signal S72*b*, which changes from 0 to 15 and then from 15 to 0, to triangular wave generating circuit 79. Accordingly, triangular wave generating circuit 79 generates a triangular wave of 4096 cycles (i.e., 122.88 μsec cycle).

19-bit register 90 outputs its upper 9 bits as a frequency division ratio to frequency dividing selector 94 and subtractor 83-2. Subtractor 83-2 outputs the value obtained by subtracting 1 from the value of the above-mentioned upper 9 bits, to frequency dividing selector 94. Frequency dividing selector 94 selects either the upper 9 bits of 19-bit register 90 or the value obtained by subtracting 1 from the value of the upper 9 bits in accordance with selection signal SELECT output from comparison unit 93, and outputs the selected value to frequency divider 95. Frequency divider 95 performs frequency division on clock CLK on the basis of the 9-bit frequency division ratio output from frequency dividing selector 94, and outputs a pulse of approximately 30% ON duty. Frequency divider 95 controls the drive frequency of drive pulse S72*a* output from output selector 97 by combining pulses with frequency division ratios whose difference is 1 using frequency dividing selector 94, and gradually changing an average division ratio per unit of time.

Output selector 97 receives the ON/OFF signal as selection signal SELECT. When the ON/OFF signal is "L," ground potential GND is selected as "L," while when the ON/OFF signal is "H," the pulse output from frequency divider 95 is selected. Then, output selector 97 outputs drives pulse S72*a*. Piezoelectric transformer 75 is driven by drive pulse S72*a* via piezoelectric transformer driving circuit 74, and a high AC voltage is output. FIG. 7 shows the waveforms of drive pulse S72*a* and the triangular wave voltage output from triangular wave generating circuit 79.

Drive pulse S72*a* output from output selector 97 is also input to 10-bit sequence generator 96. 10-bit sequence generator 96 is a 10-bit counter which counts a rising edge of drive pulse S72*a* output from output selector 97, and outputs, to comparison unit 93, a value obtained by reversing the order of the bits in the count value. Specifically, 10-bit sequence generator 96 outputs bit0 to bit9 of the 10-bit count value by replacing one bit with another as follows: bit0->bit9, bit1->bit8, bit2->bit7, bit3->bit6, bit4->bit5, bit5->bit4, bit6->bit3, bit7->bit2, bit8->bit1, bit9->bit0. For example, suppose the count value changes in the following sequence: 000H, 001H, 002H, 003H, 004H, . . . , 3FEH, 3FFH. Then, the 10-bit sequence inputted to comparison unit 93 is as follows: 000H, 200H, 100H, 300H, 080H, . . . , 1FFH, 3FFH.

Comparison unit 93 compares the 10-bit value of 10-bit sequence generator 96 with the lower 10 bits of 19-bit register 90. When the comparison result shows (the lower 10 bits of 19-bit register 90)>(the 10-bit value of 10-bit sequence generator 96), selection signal SELECT according to this comparison result is output to frequency dividing selector 94. Accordingly, frequency dividing selector 94 selects the upper 9 bits of 19-bit register 90, and outputs it to frequency divider 95. On the other hand, when the comparison result shows (the lower 10 bits of 19-bit register 90 (≦(the 10-bit value of 10-bit sequence generator 96), selection signal SELECT is inverted and output to frequency dividing selector 94. Accordingly, frequency dividing selector 94 selects the 9-bit value of subtractor 83-2, and outputs it to frequency divider 95. By performing such comparison and selection, the frequency division ratio of drive pulse S72*a* output via output selector 97 from frequency divider 95 when averaged with 1024-pulse output is given by the following formula (1):

$$\text{Frequency division ratio of drive pulse } S72a=\{(\text{the upper 9 bits of 19-bit register 90})-1\}+\{(\text{the lower 10 bits of 19-bit register 90})/1024\} \quad (1)$$

Due to a property of the sequence generated by 10-bit sequence generator 96, both the frequency division ratio of the upper 9 bits of 19-bit register 90, and the frequency division ratio in subtractor 83-2, which is 1 less than the upper 9 bits, are not likely to repeat. Even if a time period shorter than 1024 pulse cycle is used, it is possible to obtain a frequency division ratio which is close to the value given by the formula (1).

For example, when the lower 10 bits of 19-bit register 90 is 10_0000_0000b (512), selection signal SELECT input to frequency dividing selector 94 from comparison unit 93 is switched alternately for every output of drive pulse S72*a*, thus the number of pulses to obtain an average frequency is 2 for the decimal part, 0.5 (512/1024) of the average of the frequency division ratio.

Up-counter 81 is a 12-bit counter which counts up in synchronization with clock CLK when comparison result S78, which is the comparator output, is "H." The count value of up-counter 81 is reset (RESET) at each rising edge of overflow signal OVER output when 5-bit counter 86 overflows. Since 5-bit counter 86 counts up with a cycle of 128 pulses of clock CLK as described above, up-counter 81 is reset (RESET) with a cycle of 4096 clocks of CLK.

When 5-bit counter 86 overflows, the count value of up-counter 81 is latched by D-latches 82-1 and 82-2 sequentially. Accordingly, the count value immediately before the overflow is latched by D-latch 82-1, and the count value for the immediately preceding cycle is latched by D-latch 82-2. This relationship is shown in FIG. 8.

As shown in FIG. 8, the output voltage of output voltage conversion unit 88 and the triangular wave voltage output from triangular wave generating circuit 79 are input to comparator 78*a* in output voltage comparison unit 78. Up-counter 81 counts the PWM cycle of comparison result S78 output from comparator 78*a*. The count value immediately before the last overflow is latched by D-latch 82-1, and the count value therebefore is latched by D-latch 82-2. D-latch 82-1 then outputs the upper 5 bits of the latched value to subtractor 83-1. Similarly, D-latch 82-2 also outputs the upper 5 bits of the latched value to subtractor 83-1.

Subtractor 83-1 outputs a value obtained by subtracting the upper 5 bits of D-latch 82-2 from the upper 5 bits of D-latch 82-1 as a 5-bit value to table register 84. At this point, when (the upper 5 bits of D-latch 82-1)<(the upper 5 bits of D-latch 82-2), subtractor 83-1 outputs 0(00000b) to table register 84. Table register 84 references its table by the 5-bit output of subtractor 83-1 and the 12-bit output of D-latch 82-2 and outputs a 12-bit value to adder 85.

Figure 9A:
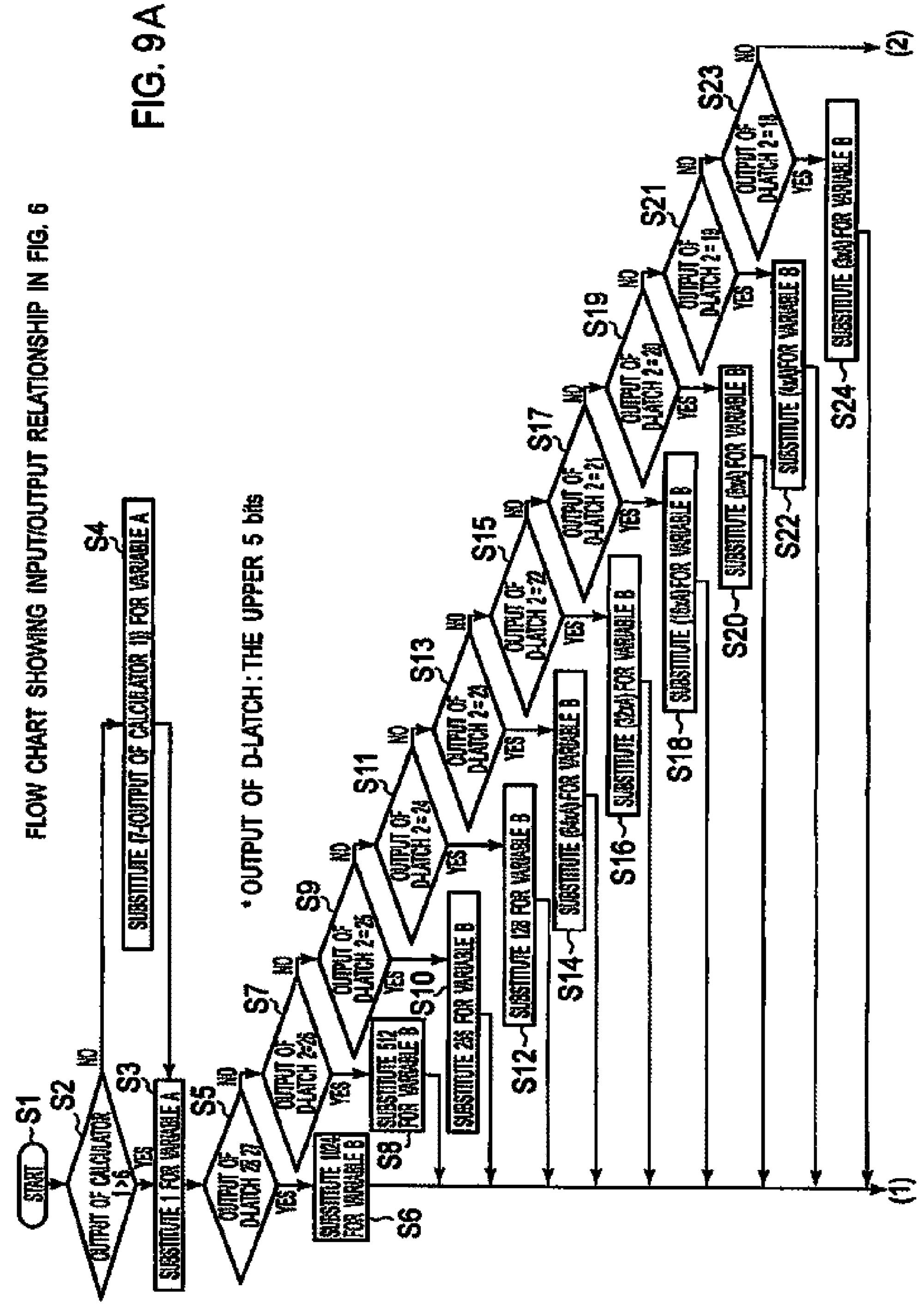
FIGS. 9A and 9B show a flow chart of an input/output relationship in FIG. 6.
Figure 9B:
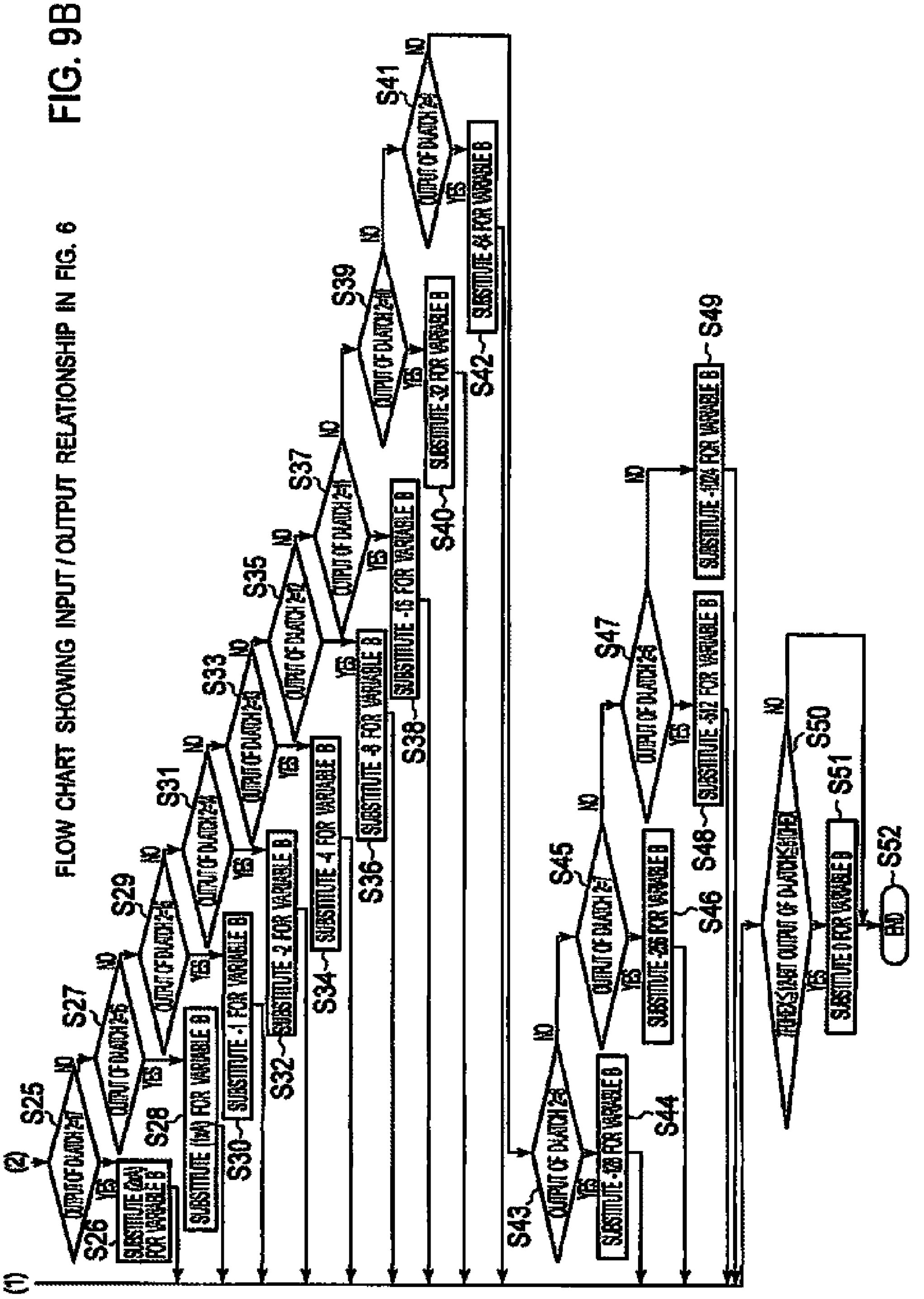

FIGS. 9A and 9B are flow charts showing the input/output relationship among D-latches 82-1, 82-2, subtractor 83-1, and table register 84 in FIG. 6.

The flow charts in FIGS. 9A and 9B are shown as an example to illustrate the operation. If the operation is implemented by a circuit, simultaneous parallel processing is possible for the value of variable B for the output of D-latches 82-1 and 82-2. In the first embodiment, since update of the value of table register 84 does not need to be fast, sequential processing may be used as shown in the flow charts. Update of table register 84 is performed every time overflow signal OVER of 5-bit counter 86 is detected. Thus, the values of D-latch 82-2 and subtractor 83-1 immediately before the update are used. The flow charts of FIGS. 9A and 9B are described below.

In the flow charts of FIGS. 9A and 9B, processing from step S1 to S52 is performed. First, the process is started in step S1, and then in step S2, it is determined whether or not the 5-bit output of calculator 83-1 is greater than 6. If it is greater (Y), the process proceeds to step S3, and if not (N), the process proceeds to step S4. In step S3, 1 is substituted for variable A. In this case, variable A is a 3-bit register. In step S4, {7−(the output of calculator 83-1)} is substituted for variable A as shown in the following conditions:

Calculator 83-1, output=0: variable A=7
Calculator 83-1, output=1: variable A=6
Calculator 83-1, output=2: variable A=5
Calculator 83-1, output=3: variable A=4
Calculator 83-1, output=4: variable A=3
Calculator 83-1, output=5: variable A=2
Calculator 83-1, output=6: variable A=1

Except for these conditions, the variable A is set as indicated in step S3.

In step S5, it is determined whether or not the output of D-latch 82-2 is greater than or equal to 27. If it is greater than or equal to 27 (Y), the process proceeds to step S6, and if not (N), the process proceeds to step S7. In step S6, 1024 is substituted for variable B. Variable B is a signed 12-bit register, and has a range of from 2047 to −2048. In step S7, it is determined whether or not the output of D-latch 82-2 is 26. If it is 26 (Y), the process proceeds to step S8, and if not (N), the process proceeds to step S9. In step S8, 512 is substituted for variable B. In step S9, it is determined whether or not the output of D-latch 82-2 is 25. If it is 25 (Y), the process proceeds to step S10, and if not (N), the process proceeds to step S11. In step S10, 256 is substituted for variable B. In step S11, it is determined whether or not the output of D-latch 82-2 is 24. If it is 24 (Y), the process proceeds to step S12, and if not (N), the process proceeds to step S13.

In step S12, 128 is substituted for variable B. In step S13, it is determined whether or not the output of D-latch 82-2 is 23. If it is 23 (Y), the process proceeds to step S14, and if not (N), the process proceeds to step S15. In step S14, (64×A) is substituted for variable B. The product of 64 and the value of variable A determined in either step S3 or step S4 is input to variable B. In step S15, it is determined whether or not the output of D-latch 82-2 is 22. If it is 22 (Y), the process proceeds to step S16, and if not (N), the process proceeds to step S17. In step S16, (32×A) is substituted for variable B. In step S17, it is determined whether or not the output of D-latch 82-2 is 21. If it is 21 (Y), the process proceeds to step S18, and if not (N), the process proceeds to step S19. In step S18, (16×A) is substituted for variable B. In step S19, it is determined whether or not the output of D-latch 82-2 is 20. If it is 20 (Y), the process proceeds to step S20, and if not (N), the process proceeds to step S21.

In step S20, (8×A) is substituted for variable B. In step S21, it is determined whether or not the output of D-latch 82-2 is 19. If it is 19 (Y), the process proceeds to step S22, and if not (N), the process proceeds to step S23. In step S22, (4×A) is substituted for variable B. In step S23, it is determined whether or not the output of D-latch 82-2 is 18. If it is 18 (Y), the process proceeds to step S24, and if not (N), the process proceeds to step S25. In step S24, (3×A) is substituted for variable B. In step S25, it is determined whether or not the output of D-latch 82-2 is 17. If it is 17 (Y), the process proceeds to step S26, and if not (N), the process proceeds to step S27. In step S26, (2×A) is substituted for variable B. In step S27, it is determined whether or not the output of D-latch 82-2 is 16. If it is 16 (Y), the process proceeds to step S28, and if not (N), the process proceeds to step S29.

In step S28, (1×A) is substituted for variable B. In step S29, it is determined whether or not the output of D-latch 82-2 is 15. If it is 15 (Y), the process proceeds to step S30, and if not (N), the process proceeds to step S31. In step S30, (−1) is substituted for variable B. In step S31, it is determined whether or not the output of D-latch 82-2 is 14. If it is 14 (Y), the process proceeds to step S32, and if not (N), the process proceeds to step S33. In step S32, (−2) is substituted for variable B. In step S33, it is determined whether or not the output of D-latch 82-2 is 13. If it is 13 (Y), the process proceeds to step S34, and if not (N), the process proceeds to step S35. In step S34, (−4) is substituted for variable B. In step S35, it is determined whether the output of D-latch 82-2 is 12. If it is 12 (Y), the process proceeds to step S36, and if not (N), the process proceeds to step S37.

In step S36, (−8) is substituted for variable B. In step S37, it is determined whether or not the output of D-latch 82-2 is 11. If it is 11 (Y), the process proceeds to step S38, and if not (N), the process proceeds to step S39. In step S38, (−16) is substituted for variable B. In step S39, it is determined whether or not the output of D-latch 82-2 is 10. If it is 10 (Y), the process proceeds to step S40, and if not (N), the process proceeds to step S41. In step S40, 32 is substituted for variable B. In step S41, it is determined whether or not the output of D-latch 82-2 is 9. If it is 9 (Y), the process proceeds to step S42, and if not (N), the process proceeds to step S43. In step S42, (−64) is substituted for variable B. In step S43, it is determined whether or not the output of D-latch 82-2 is 8. If it is 8 (Y), the process proceeds to step S44, and if not (N), the process proceeds to step S45.

In step S44, (−128) is substituted for variable B. In step S45, it is determined whether or not the output of D-latch 82-2 is 7. If it is 7 (Y), the process proceeds to step S46, and if not (N), the process proceeds to step S47. In step S46, (−256) is substituted for variable B. In step S47, it is determined whether or not the output of D-latch 82-2 is 6. If it is 6 (Y), the process proceeds to step S48, and if not (N), the process proceeds to step S49. In step S48, (−512) is substituted for variable B. In step S49, (−1024) is substituted for variable B. When the output of D-latch 82-2 is in a range of from 0 to 5, it is determined in step S50 whether or not the 12-bit output of D-latch 82-2 is in a range of from 7F0 hex to 810 hex. If it is (Y), the process proceeds to step S51, and if not (N), the process proceeds to step S52. In step S51, 0 is substituted for variable B, and then the process is terminated in step S52.

As described above, a 12-bit value is set to table register 84 in FIG. 6. As shown in steps S50 and S51, when the PWM duty of comparison result S78 with a triangular wave is in a neighborhood of 50%, 0 is set to B so as not to add or subtract any value to or from the PWM duty. The 12-bit value of table register 84 is output to adder 85.

Adder 85 performs addition at a rising edge of a signal input from timer (frequency divider) 89. Timer (frequency divider) 89 operates with the cycle of the 16-bit signal output from calculator 83-2. Adder 85 extends the 12-bit signed data output from table register 84, to 19-bit data, and then adds the 19-bit data to the 19-bit value of 19-bit register 90. Although the update cycle of table register 84 differs from the addition cycle of adder 85, there is no problem with this because adder 85 just uses the same table register value as the previous one.

Adder 85 compares the above-mentioned addition result with the values of two registers, namely, counter upper limit value register 91 and counter lower limit value register 92. When the upper 9 bits of the 19 bits of the addition result of adder 85 are compared with the 9-bit value of counter upper limit value register 91 and are found greater than the counter upper limit, adder 85 replaces the upper 9 bits of the addition result with the 9-bit value of counter upper limit value register 91. Adder 85 sets the replaced 19-bit value to 19-bit register 90. Similarly, when the upper 9 bits of the 19 bits of the addition result of adder 85 are compared with the 9-bit value of counter lower limit value register 91 and are found smaller than the counter lower limit, adder 85 replaces the upper 9 bits of the addition result with the 9-bit value of counter lower limit value register 91. Adder 85 sets the replaced 19-bit value to 19-bit register 90.

In the first embodiment, the 9-bit counter upper limit value is 12E hex (302 dec), and the 9-bit counter lower limit value is 113 hex (275 dec). Although counter upper limit value register 91 and counter lower limit value register 92 are configured to have fixed values held in controller 72 in the first embodiment, they may be configured to have values set to a rewritable random access memory (hereinafter referred to as "RAM") by printer engine controller 53.

At a time of reset, a 19-bit value is set to 19-bit register 90 by calculator 83-1. Calculator 83-1 performs the following calculation (2) for the 9-bit value of DAC preset value D53*a:*

$$275\times1024+(\text{target voltage signal})\times32 \quad (2)$$

For example, if the target voltage is 5 kV and DAC preset value D53*a* is 500, 297600 dec, i.e., 48A80 hex is set. The upper 9 bits of 19-bit register 90 are 122 hex, i.e., 290 dec, and the lower 10 bits thereof are 280 hex, i.e., 640 dec.

As described above, when the difference between the high voltage output and target voltage V53*a* is large, the amount of change in frequency division ratio is set to be large, whereas when the difference becomes small, the amount of change in frequency division ratio is set to be small, whereby both stable voltage control and short rise time can be achieved. Moreover, no overshoot occurs and a quick start-up is possible by changing the gain in accordance with an amount of change in output voltage per unit time before the target voltage is obtained.

Modification of First Embodiment

In addition to the modifications described above, it is also possible to employ other modifications of the first embodiment (a) to (j) below.

(a) Although reset signal RESET and the ON/OFF signal are provided, when the ON/OFF signal is "L" it may be used as reset signal RESET.

(b) Although the frequency of clock CLK is set to 33.33 MHz, other frequencies may also be used. A set of 10 bits, i.e., 1024 pulses are used to change the frequency division ratio, but a value smaller than 10 bits as in the case of the first embodiment (e.g., 6 bits, 7 bits, 8 bits, 9 bits, etc.) or greater than 10 bits (e.g., 11 bits, 12 bits, etc.) may also be used.

(c) Although piezoelectric transformer 75 having a resonance frequency of approximately 110 kHz and a drive frequency in a range of 110 to 130 kHz is used, it may possible to use a smaller piezoelectric transformer with a higher drive frequency, or a larger piezoelectric transformer with a lower drive frequency.

(d) Although counter upper limit value register 91 and counter lower limit value register 92 for setting the upper and lower limits of the drive frequency are configured to have fixed values held in controller 72, it is possible to set the values by transmitting them from printer engine controller 53. Instead of using fixed values, characteristics of individual piezoelectric transformer 75 are measured and limit values may be stored in a nonvolatile memory or the like and used.

(e) Initial drive frequency of piezoelectric transformer 75 is set to a fixed value held in controller 72, but may be variable according to DAC preset value D53*a* which sets target voltage V53*a*, and may be transmitted to controller 72 from printer engine controller 53.

(f) Controller 72 for driving piezoelectric transformer 75 is provided in power supply device 70, but may be incorporated in a LSI of printer engine controller 53 or the like.

(g) Description has been given while assuming that there is single high voltage circuit for transfer, but it is easy to control multiple channels by aligning the same circuits. A color image forming apparatus usually has four high voltage channels for transfer; however, with the configuration of the first embodiment, special components are not needed for a microprocessor, LSI, or the like that is usually used for printer engine controller 53, because a signal from printer engine controller 53 is switched only when high voltage output is set ON/OFF. Moreover, even if all high voltage outputs except one for transfer are configured by circuits using piezoelectric transformers 75, optimal component constants and the like are selected for each circuit so as to easily achieve such a configuration that the number of channels may be about 10 to 20.

(h) In the above description, DAC53*a* is used as a target setter to form an output-variable high voltage circuit for transfer. However, in the case where the circuit is used for high voltage output which does not require output variability, the configuration may be such that a constant voltage circuit or the like with a Zener diode and voltage dividing resistors may be used as a target setter to supply an input to comparators 79*b*-1 to 79-4 in triangular wave generating circuit 79*b*.

(i) In the first embodiment, a positive bias circuit is described, but even with a negative bias circuit, the invention can be implemented by using an inverting amplifier circuit or the like for op-amp 77*d* in output voltage conversion unit 77.

(j) Comparison result S78 between the output voltages of triangular wave generating circuit 79 and output voltage conversion unit 77 is designed to have a PWM duty of 50% at target voltage V53*a*; however, the configuration may be such that the PWM duty is different at target voltage V53*a* by generating a triangular wave voltage which has a constant peak corresponding to the maximum target voltage V53*a* and by inputting DAC preset value D53*a* to table register 84.

Advantageous Effects of First Embodiment

According to the first embodiment, the following advantageous effects (1) to (3) are achieved.

(1) According to the first embodiment, comparator 78*a* in output voltage comparison unit 78 compares a low DC voltage reduced from a high DC voltage by output voltage conversion unit 77, with a triangular wave voltage output from triangular wave generating circuit 79 by target setter DAC53*a* serving as the target setter, the high DC voltage being obtained by rectifying the output voltage from the secondary side of piezoelectric transformer 75. The frequency division ratio and the amount of change in frequency division ratio are controlled according to the rectangular wave's duty of comparison result S78. Thus, both a quick rise and constant voltage control are achieved over a range of from a low high-voltage output to a high high-voltage output near the resonance frequency of piezoelectric transformer 75. Moreover, since a wide range of output can be obtained, a stable output is achieved regardless of the environment, and further, image forming apparatus 1 can provide a stable image without non-uniform density and a horizontal line.

(2) By using digital signals for drive pulse S72*a* and comparison result S78 as the comparator output, the power supply device of the invention may be implemented by integrated circuits such as LSI, whereby the number of components may be substantially reduced. In addition, since a frequency division ratio limiter including counter upper limit value register 91 and counter lower limit value register 92 is provided to maintain the drive frequency above the resonance frequency of piezoelectric transformer 75, there does not occur a problem of controlling the high voltage output to be a low voltage by instantaneous load fluctuation or the like causing the drive frequency to be controlled to be lower than the resonance frequency.

(3) Since drive pulse generation and drive frequency control are achieved without using CPU program code or the like, stable constant voltage control is possible even with multiple channels. Moreover, by combining pulses with different frequency division ratios by frequency dividing selector 94, the average frequency resolution may be easily increased, rather than using a multiplying circuit such as a phase locked loop (PLL).

Second Embodiment

A second embodiment of the invention has the same configurations as those of image forming apparatus 1 in FIG. 3 and the control circuit in FIG. 4 of the first embodiment, but has a different configuration from that of power supply device 70 in FIGS. 1 and 2 of the first embodiment. Thus, the power supply device according to the second embodiment is described below.

(Configuration of Power Supply Device)

Figure 10:
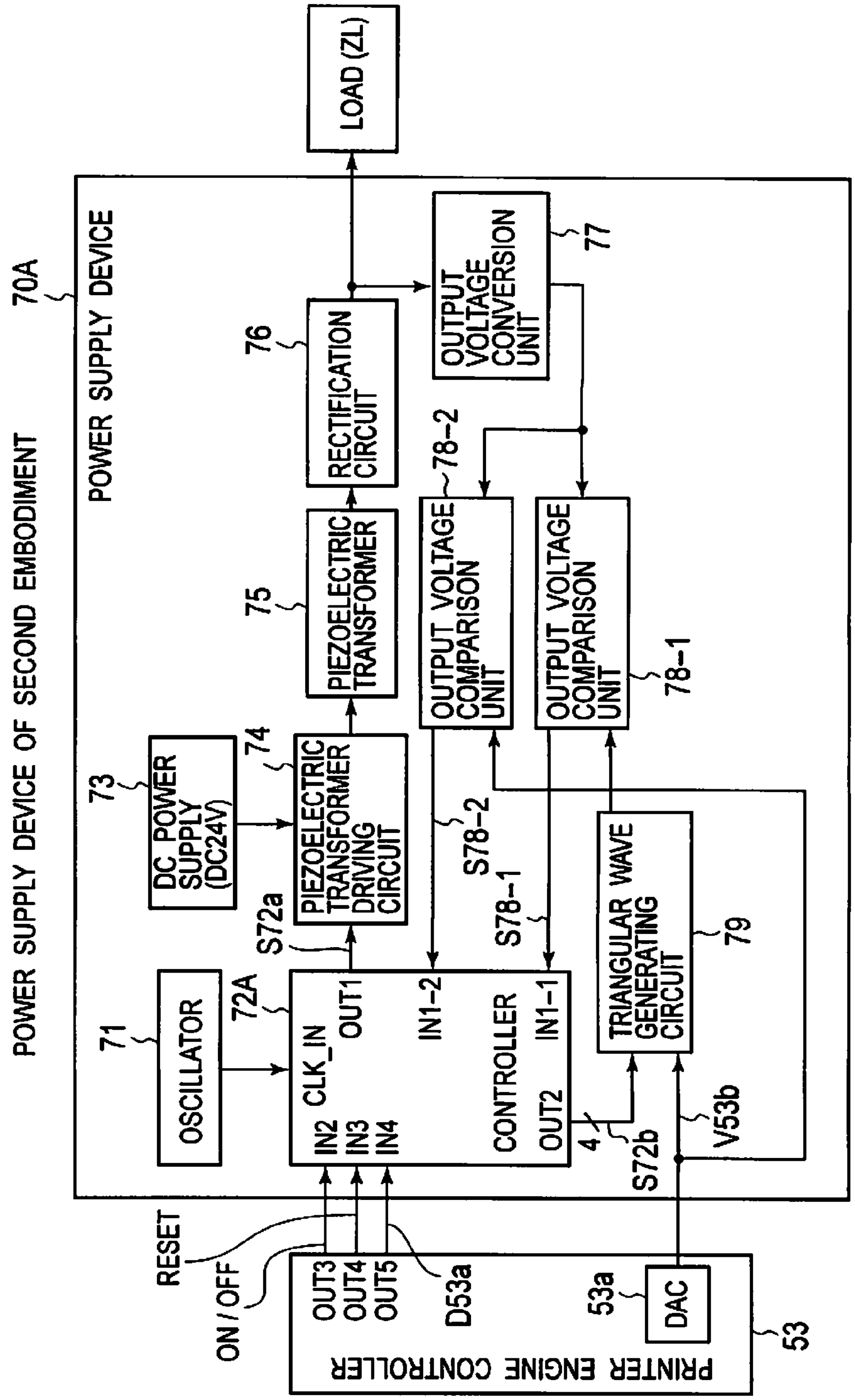
FIG. 10 is a block diagram schematically showing a configuration of a power supply device in a second embodiment of the invention.

FIG. 10 is a block diagram schematically showing a configuration of the power supply device in the second embodiment of the invention. The same reference numerals are given to components common between FIG. 10 and FIG. 1 showing the power supply device of the first embodiment.

Power supply device 70A of the second embodiment shows only one circuit for one color as in the case of the first embodiment. Instead of controller 72 and output voltage comparison unit 78 of the first embodiment, controller 72A and two comparison units 78-1 and 78-2 with different configurations (e.g., first and second output voltage comparison units) are provided. Other configurations are the same as those of the first embodiment.

Controller 72A of the second embodiment is a circuit configured to operate in synchronization with clock CLK supplied from oscillator 71, and outputs drive pulse S72*a* under the control of printer engine controller 53. Similarly to the first embodiment, controller 72A includes: input port CLK_IN for receiving clock CLK; input port IN2 for receiving an ON/OFF signal; input port IN3 for receiving reset signal RESET; input port IN4 for receiving DAC preset value D53*a*; input port IN1-1 for receiving first comparison result S78-1; output port OUT1 for outputting drive pulse S72*a*; output port OUT2 for outputting 4-bit TTL signal S72*b*; and, additionally, input-port IN1-2 for receiving second comparison result S78-2. Similar to the first embodiment, controller 72A is an ASIC, a microprocessor with a built-in CPU, an FPGA, or the like.

Similarly to output voltage comparison unit 78 of the first embodiment, first output voltage comparison unit 78-1 is configured to compare the output voltage of output voltage conversion unit 77 with the triangular wave voltage which is output from triangular wave generating circuit 79 and has an amplitude twice that of target voltage V53*a*, and output first comparison result S78-1 to input port IN1-1 of controller 72A. Newly added output voltage comparison unit 78-2 is configured to compare the output voltage of output voltage conversion unit 77 with target voltage V53*a*, and input second comparison result S78-2 to input port IN1-2 of controller 72A.

Figure 11:
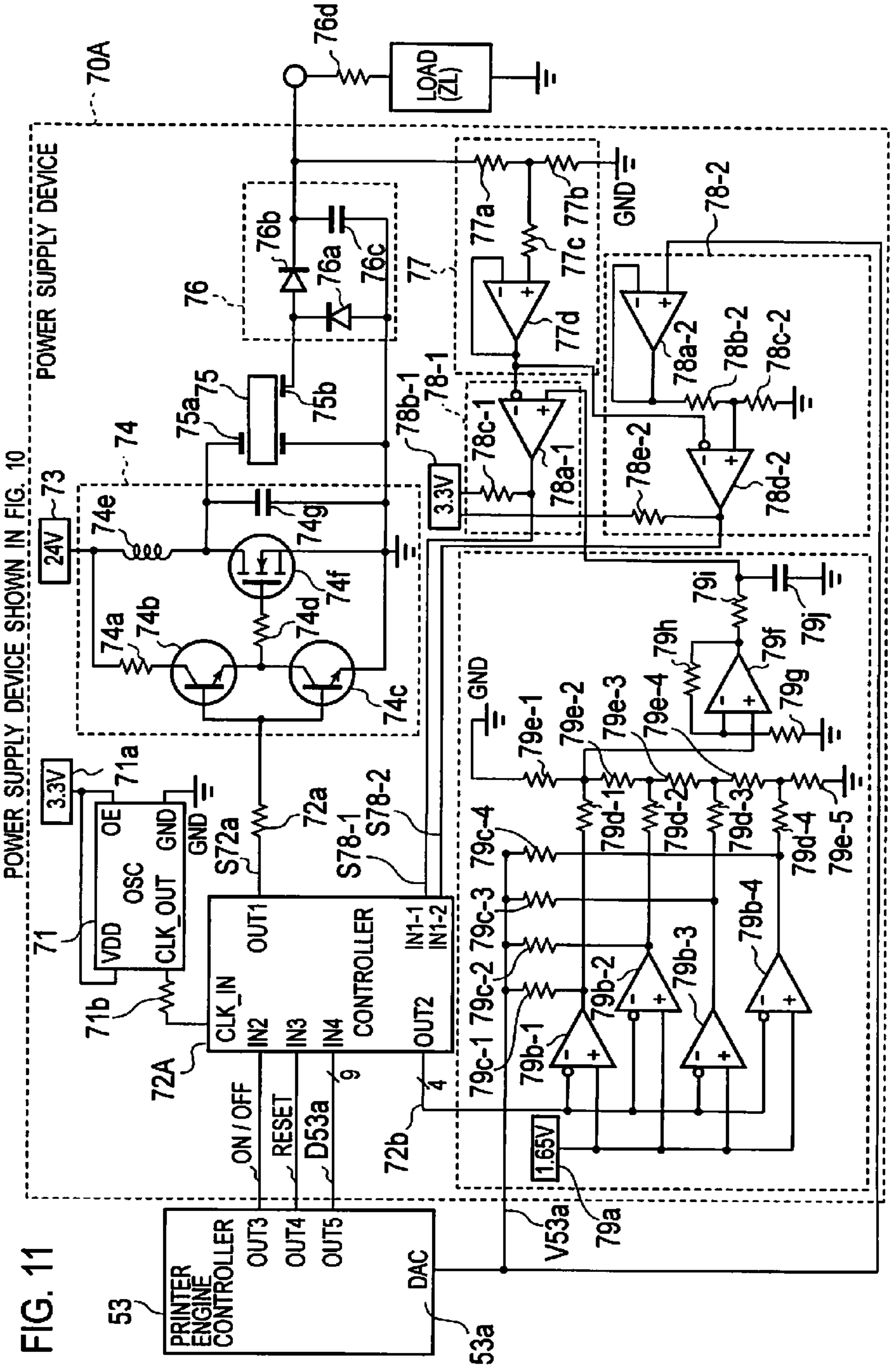
FIG. 11 is a circuit diagram showing a detailed configuration example of power supply device 70A shown in FIG. 10.

FIG. 11 is a circuit diagram showing a detailed configuration example of power supply device 70A in FIG. 10. The same reference numerals are given to components common between FIG. 11 and FIG. 2 showing the first embodiment.

Similar to output voltage comparison unit 78 of the first embodiment, first output voltage comparison unit 78-1 is comprised of: comparator 78*a*-1 as a voltage comparator to which DC 24V is applied from DC power supply 73; and DC 3.3V power supply 78*b* as well as pull-up resistor 78*c*-1 configured to pull up the output terminal of comparator 78*a*-1. Comparator 78*a*-1 is a circuit comprised of: a "−" input terminal configured to receive an output voltage of a voltage follower circuit; and a "+" input terminal configured to receive a triangular wave voltage output from triangular wave generating circuit 79. Comparator 78*a*-1 is configured to compare the voltage at the "−" input terminal with the voltage at the "+" input terminal, and output first comparison result S78-1 from an output terminal to input port IN1-1 of controller 72A. The output terminal of comparator 78*a*-1 is connected to DC 3.3V power supply 78*b* via pull-up resistor 78*c*-1.

Second output voltage comparison unit 78-2 includes two op-amps 78*a*-2, 78*d*-2, three resistors 78*b*-2, 78*c*-2, 78*e*-2, and comparator 78*d*-2. Op-amp 78*a*-2 and resistors 78*b*-2 and 78*c*-2 comprise a circuit configured to divide the output voltage of the voltage follower circuit and to output target voltage V53*a* output from DAC53*a* which is made one half of the output peak voltage of triangular wave generating circuit 79. Comparator 78*d*-2 is a circuit configured to compare the output voltage of output voltage conversion unit 77 with the output voltage of op-amp 78*a*-2 and to output the comparison result. The output terminal of comparator 78*d*-2 is pulled up by 3.3V power supply 78*b* via resistor 78*e*-2. Other configurations are the same as those of the first embodiment.

(Configuration of Controller in Power Supply Device)

Figure 12:
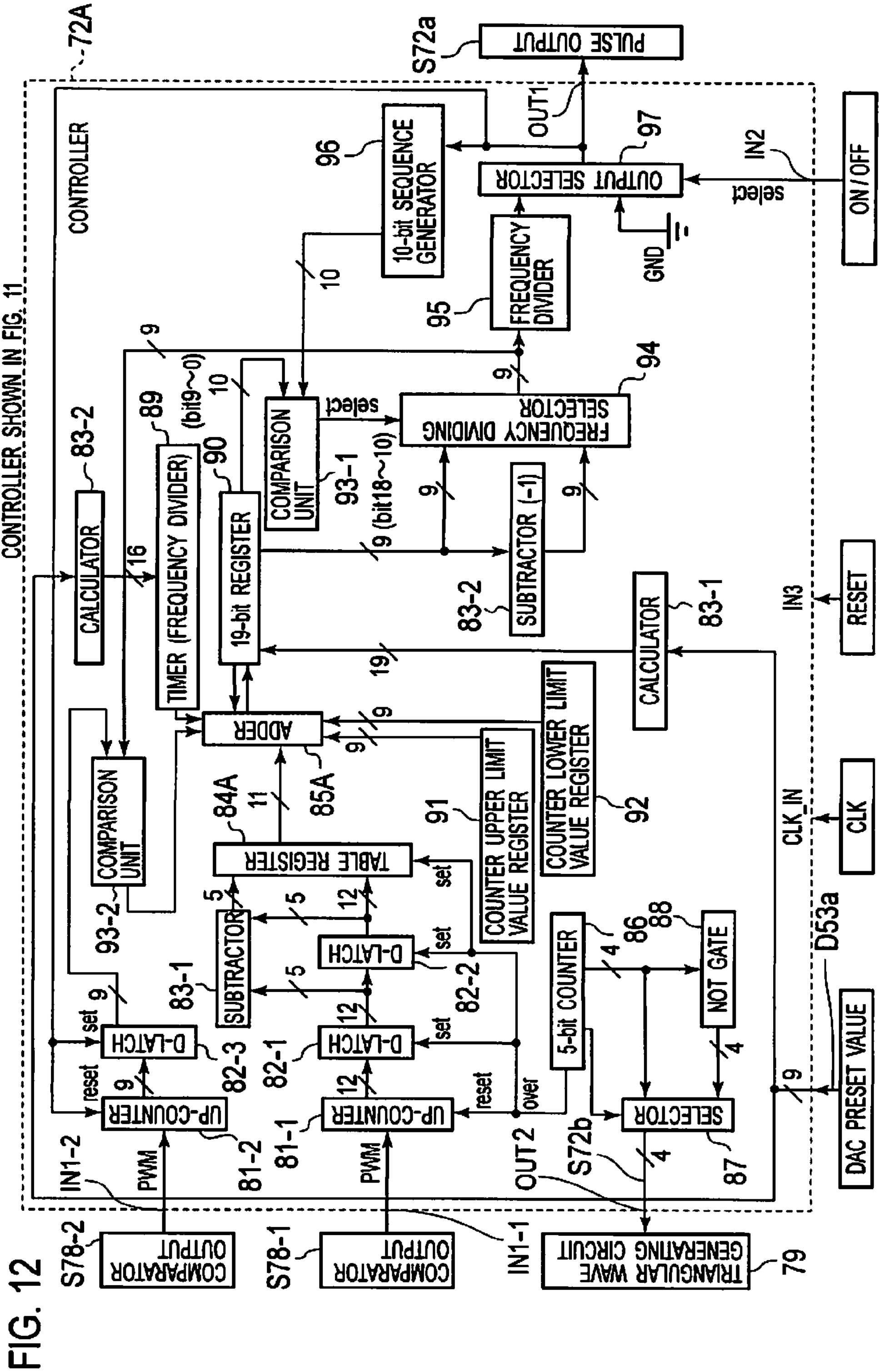
FIG. 12 is a configuration diagram showing controller 72A in FIG. 11.

FIG. 12 is a configuration diagram showing controller 72A in FIG. 11. The same reference numerals are given to components common between FIG. 12 and FIG. 6 showing controller 72 of Example 1.

Controller 72A of the second embodiment includes first up-counter 81-1, table register 84A, adder 85A, and first comparison unit 93-1 instead of up-counter 81, table register 84, adder 85, and comparison unit 93 in controller 72 of the first embodiment, and, additionally, includes second up-counter 81-2, third D-latch 82-3, and second comparison unit 93-2.

Up-counter 81-1 and comparison unit 93-1 are similar to up-counter 81 and comparison unit 93 of the first embodiment. Up-counter 81-2 is a 9-bit counter configured to count up clock CLK while comparison result S78-2 input from input port IN1-2 is "H." The count value of up-counter 81-2 is reset to 0 at a rise of drive pulse S72*a* output from output selector 97, and the 9-bit count value of up-counter 81-2 is output to D-latch 82-3. D-latch 82-3 is configured to latch the 9-bit count value of up-counter 81-2 at a rise of drive pulse S72*a* output from output selector 97, and to output the latched 9-bit count value to second comparison unit 93-2.

Comparison unit 93-2 is a circuit configured to compare the 9-bit count value output from D-latch 82-3 with one half of the 9-bit output value of frequency dividing selector 94 (i.e., a 9-bit value obtained by shifting the 9-bit value of frequency dividing selector 94 by 1-bit to the right, and setting 0 to the uppermost bit of the resulting 9 bits). When (the output value of D-latch 82-3)>(the output value of selector 97), comparison unit 93-2 outputs "H" of 1-bit as a comparison result to adder 85A; otherwise, comparison unit 93-2 outputs "L" of 1-bit as a comparison result to adder 85A.

Table register 84A is configured to generate an 11-bit value from the 5-bit output value of subtractor 83-1 and the 12-bit output value of D-latch 82-2, and differs from table register 84 of the first embodiment in that table register 84A outputs an 11-bit value without a sign bit. Adder 85A is configured to add or subtract the value of table register 84A to or from the value of 19-bit register 90 in accordance with the output value of comparison unit 93-2 (i.e., if the output of comparison unit 93-2 is "H," adder 85A performs addition, and if it is "L," adder 85A performs subtraction.). Other configurations are the same as those of the first embodiment.

In the above configurations, the second embodiment shares the same operation as that of the image forming apparatus 1 in FIG. 3 and the control circuit in FIG. 4 of the first embodiment. Operation of the power supply device and the controller in the second embodiment, which is different from that in the first embodiment, is described below.

(Operation of Power Supply Device)

In power supply device 70A of FIG. 10, a high DC voltage output from rectification circuit 76 is divided and converted into a low DC voltage by output voltage conversion unit 77, and then input to first and second output voltage comparison units 78-1 and 78-2. When first output voltage comparison unit 78-1 receives a triangular wave which has a peak voltage twice that of the output voltage of output voltage conversion unit 77 at the time the target voltage is obtained, from triangular wave generating circuit 79, the comparison unit 78-1 compares the voltage of this triangular wave with the output voltage of output voltage conversion unit 77. As first comparison result S78-1, the PWM signal of the triangular wave generation cycle is input to input port IN1-1 of controller 72A. The PWM duty is 100% at high voltage output of 0V, 50% at target voltage V53*a*, and 0% at twice target voltage V53*a*.

After target voltage V53*a* output from DAC53*a* is amplified to a level comparable to the output voltage of output voltage conversion unit 77, second output voltage comparison unit 78-2 compares the amplified voltage with the output voltage of output voltage conversion unit 77. When the output voltage of output voltage conversion unit 77 is lower than target voltage V53*a*, second output voltage comparison unit 78-2 outputs "H" as comparison result S78-2 to input port IN1-2 of controller 72A, while outputting "L" as the comparison result to input port IN1-2 of controller 72A when the output voltage of output voltage conversion unit 77 is higher than target voltage V53*a*. When the output voltage of output voltage conversion unit 77 is equal to target voltage V53*a*, a rectangular wave is input to input port IN1-2 of controller 72A by remaining ripple in the high DC voltage rectified by rectification circuit 76.

Controller 72A performs constant voltage control so that comparison result S78-2 output from output voltage comparison unit 78-2 would become a rectangular wave, and determines a gain to change the piezoelectric transformer drive frequency in accordance with the PWM duty of comparison result S78-1 output from output voltage comparison unit 78-1.

In power supply device 70A of FIG. 11, output voltage comparison unit 78-2 inverts and amplifies 9-bit target voltage V53*a* output from DAC53*a* to a value corresponding to the output voltage of output voltage conversion unit 77 by using op-amp 78*a*-2. For example, at the time of outputting a target voltage of 5 kV, DAC53*a* has a digital value of 1F4 hex (500 dec), and target voltage V53*a* output from DAC53*a* is $3.3\times 500/511=3.23$ V. Output voltage conversion unit 77 performs voltage division to reduce a high voltage output to $1/2001$ thereof by using the same constants used in the first embodiment. Therefore, when high voltage output is 5 kV, the output voltage of output voltage conversion unit 77 is 2.50 V.

Target voltage V53*a* output from DAC53*a* is divided by resistors 78*b*-2 and 78*c*-2 via the voltage follower of op-amp 78*a*-2 in output voltage comparison unit 78-2, then converted into 2.50V, and thereafter input to the "+" input terminal of comparator 78*d*-2. The output voltage of output voltage conversion unit 77 is input to the "−" input terminal of comparator 78*d*-2, and the output terminal of comparator 78*d*-2 is pulled up by 3.3 V power supply 78*b* via resistor 78*e*-2. Accordingly, when the output voltage of output voltage conversion unit 77 is lower than target voltage V53*a*, DC 3.3 V (="H") of power supply 78*b* is input to input port IN1-2 of controller 72A, while when the output voltage of output voltage conversion unit 77 is higher than target voltage V53*a*, the voltage level of comparator 78*d*-2 is input to input port IN1-2 of controller 72A.

(Operation of Controller in Power Supply Device)

Figure 13A:
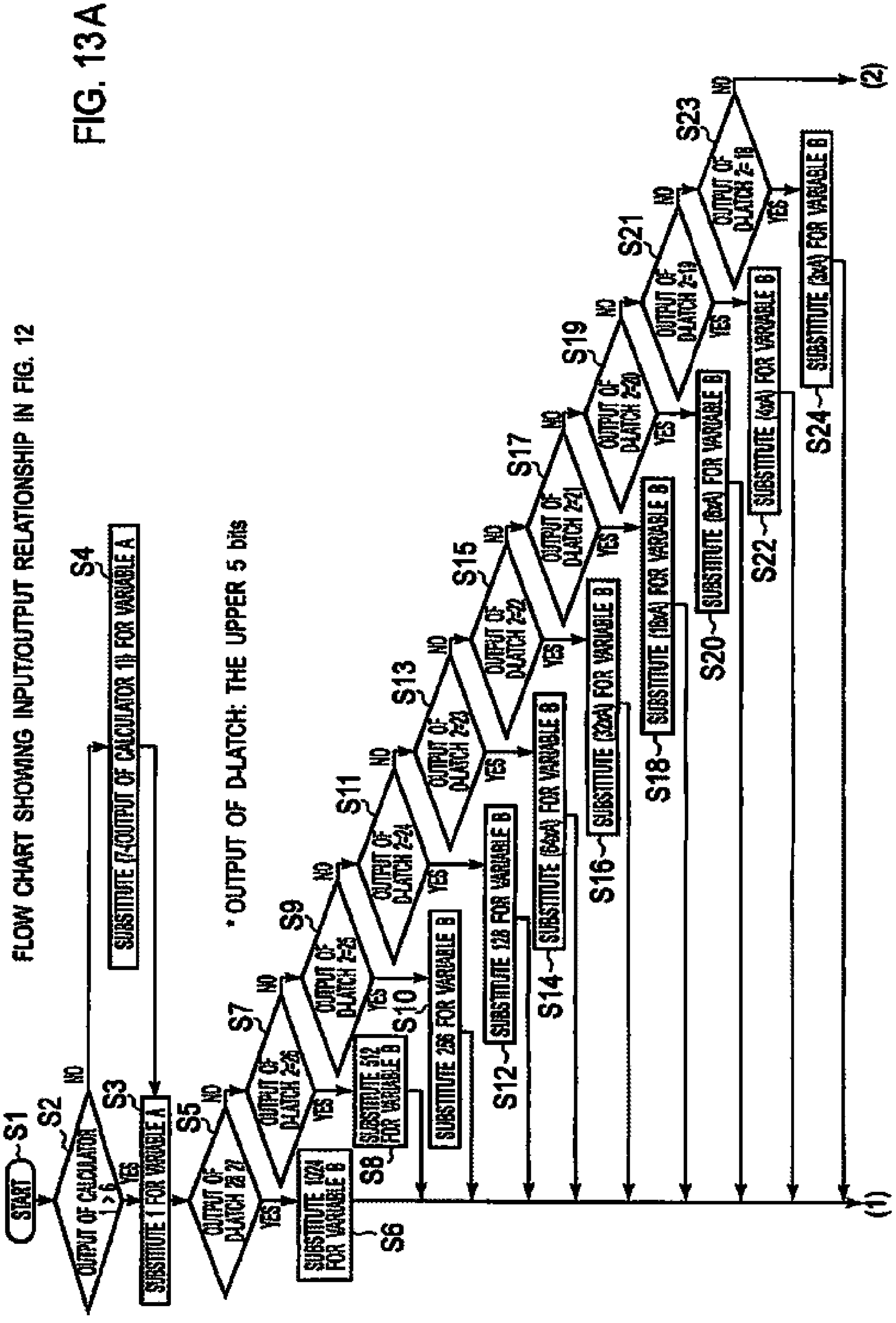
FIGS. 13A and 13B show a flow chart of an input/output relationship in FIG. 12.
Figure 13B:
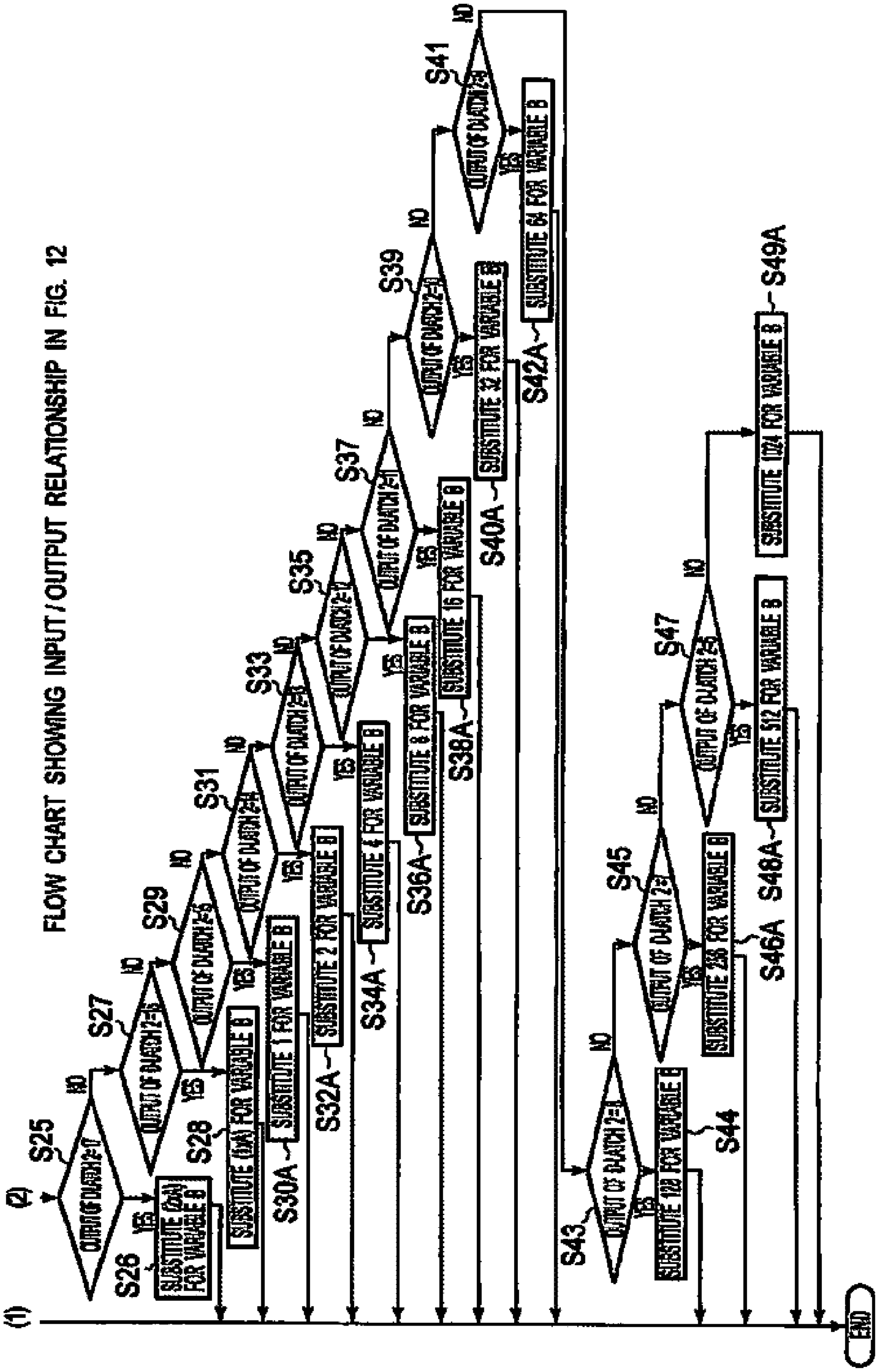

FIGS. 13A and 13B are flow charts showing operation of table register 84A in FIG. 12. The same reference numerals are given to steps common between FIGS. 13A and 13B and FIGS. 9A and 9B showing the flow charts of the first embodiment.

In controller 72A of FIG. 12, table register 84A follows the flow charts of FIGS. 13A and 13B, and outputs 11-bit data to adder 85A by using the 5-bit output value of subtractor 83-1 and the 12-bit output value of D-latch 82-2.

In the flow charts of FIGS. 13A and 13B, instead of performing processing in steps S30, S32, S34, S36, S38, S40, S42, S44, S46, S48, and S49 in the steps S1 to S52 of the flow charts of FIGS. 9A and 9B showing the first embodiment, different steps S30A, S32A, S34A, S36A, S38A, S40A, S42A, S44A, S46A, S48A, and S49A are performed.

In step S1, the process is started, and then in step S2, it is determined whether or not the 5-bit output of calculator 83-1 is greater than 6. If it is greater, the process proceeds to step S3, and if not, the process proceeds to step S4. In step S3, 1 is substituted for variable A. In this case, the variable is a 3-bit register. In step S4, {7−(the output of calculator 83-1)} is substituted for variable A as shown in the following conditions:

Calculator 83-1, output=0: variable A=7
Calculator 83-1, output=1: variable A=6
Calculator 83-1, output=2: variable A=5
Calculator 83-1, output=3: variable A=4
Calculator 83-1, output=4: variable A=3
Calculator 83-1, output=5: variable A=2
Calculator 83-1, output=6: variable A=1

Except for these conditions, the variable A is set as indicated in step S3.

In step S5, it is determined whether or not the output of D-latch 82-2 is greater than or equal to 27. If it is greater, the process proceeds to step S6, and if not, the process proceeds to step S7. In step S6, 1024 is substituted for variable B. Variable B is a non-signed 11-bit register, and has a range of from 0 to 2047. In step S7, it is determined whether or not the output of D-latch 82-2 is 26. If it is 26, the process proceeds to step S8, and if not, the process proceeds to step S9. In step S8, 512 is substituted for variable B. In step S9, it is determined whether or not the output of D-latch 82-2 is 25. If it is 25, the process proceeds to step S10, and if not, the process proceeds to step S11. In step S10, 256 is substituted for variable B. In step S11, it is determined whether or not the output of D-latch 82-2 is 24. If it is 24, the process proceeds to step S12, and if not, the process proceeds to step S13.

In step S12, 128 is substituted for variable B. In step S13, it is determined whether or not the output of D-latch 82-2 is 23. If it is 23, the process proceeds to step S14, and if not, the process proceeds to step S15. In step S14, (64×A) is substituted for variable B. The product of 64 and the value of variable A determined in either step S3 or step S4 is input to variable B. In step S15, it is determined whether or not the output of D-latch 82-2 is 22. If it is 22, the process proceeds to step S16, and if not, the process proceeds to step S17. In step S16, (32×A) is substituted for variable B. In step S17, it is determined whether or not the output of D-latch 82-2 is 21. If it is 21, the process proceeds to step S18, and if not, the process proceeds to step S19. In step S18, (16×A) is substituted for variable B. In step S19, it is determined whether or not the output of D-latch 82-2 is 20. If it is 20, the process proceeds to step S20, and if not, the process proceeds to step S21.

In step S20, (8×A) is substituted for variable B. In step S21, it is determined whether or not the output of D-latch 82-2 is 19. If it is 19, the process proceeds to step S22, and if not, the process proceeds to step S23. In step S22, (4×A) is substituted for variable B. In step S23, it is determined whether or not the output of D-latch 82-2 is 18. If it is 18, the process proceeds to step S24, and if not, the process proceeds to step S25. In step S24, (3×A) is substituted for variable B. In step S25, it is determined whether or not the output of D-latch 82-2 is 17. If it is 17, the process proceeds to step S26, and if not, the process proceeds to step S27. In step S26, (2×A) is substituted for variable B. In step S27, it is determined whether or not the output of D-latch 82-2 is 16. If it is 16, the process proceeds to step S28, and if not, the process proceeds to step S29. In step S28, (1×A) is substituted for variable B. In step S29, it is determined whether or not the output of D-latch 82-2 is 15. If it is 15, the process proceeds to step S30, and if not, the process proceeds to step S31.

In step S30A, 1 is substituted for variable B. In step S31, it is determined whether or not the output of D-latch 82-2 is 14. If it is 14, the process proceeds to step S32A, and if not, the process proceeds to step S33. In step S32A, 2 is substituted for variable B. In step S33, it is determined whether or not the output of D-latch 82-2 is 13. If it is 13, the process proceeds to step S34A, and if not, the process proceeds to step S35. In step S34A, 4 is substituted for variable B. In step S35, it is determined whether or not the output of D-latch 82-2 is 12. If it is 12, the process proceeds to step S36A, and if not, the process proceeds to step S37. In step S36A, 8 is substituted for variable B. In step S37, it is determined whether or not the output of D-latch 82-2 is 11. If it is 11, the process proceeds to step S38A, and if not, the process proceeds to step S39. In step S38A, 16 is substituted for variable B.

In step S39, it is determined whether or not the output of D-latch 82-2 is 10. If it is 10, the process proceeds to step S40A, and if not, the process proceeds to step S41. In step S40A, 32 is substituted for variable B. In step S41, it is determined whether or not the output of D-latch 82-2 is 9. If it is 9, the process proceeds to step S42A, and if not, the process proceeds to step S43. In step S42A, 64 is substituted for variable B. In step S43, it is determined whether or not the output of D-latch 82-2 is 8. If it is 8, the process proceeds to step S44A, and if not, the process proceeds to step S45. In step S44A, 128 is substituted for variable B.

In step S45, it is determined whether or not the output of D-latch 82-2 is 7. If it is 7, the process proceeds to step S46A, and if not, the process proceeds to step S47. In step S46A, 256 is substituted for variable B. In step S47, it is determined whether or not the output of D-latch 82-2 is 6. If it is 6, the process proceeds to step S48A, and if not, the process proceeds to step S49A. In step S48A, 512 is substituted for variable B. In step S49A, when the output of D-latch 82-2 is in a range of from 0 to 5, 1024 is substituted for variable B, and then the process is terminated in step S52.

As described above, the second embodiment differs from the first embodiment in that there are conditions in the second embodiment where positive values are set, but in the first embodiment, negative values are set, and also there are no conditions in the first embodiment where 0 is not set.

Comparison unit 93-2 compares the 9-bit output value of frequency dividing selector 94 with the 9-bit value of D-latch 82-3, and outputs a resulting signal to adder 85A. Specifically, comparison unit 93-2 compares the 9-bit latched value of D-latch 82-3 with ½ of the 9-bit output value of frequency dividing selector 94, i.e., a 9-bit value obtained by shifting the 9-bit output value by 1 bit to the right and setting 0 to the uppermost bit. When (the value of D-latch 82-3)>(½ of the output value of frequency dividing selector 94), comparison unit 93-2 outputs "H" to adder 85A, and when (the value of D-latch 82-3)≦(½ of the output value of frequency dividing selector 94), comparison unit 93-2 outputs "L" to adder 85A.

When the output of comparison unit 93-2 is "H" at a rise of an input signal from timer (frequency divider) 89, adder 85A updates 19-bit register 90 by adding the 11-bit value from table register 84A to the value of 19-bit register 90, while when the output of comparison unit 93-2 is "L," adder 85A updates 19-bit register 90 by performing subtraction.

According to the operation described above, when high voltage output is lower than target voltage V53*a*, the frequency division ratio is controlled to be larger, while when high voltage output is higher than target voltage V53*a*, the frequency division ratio is controlled to be smaller.

Figure 14:
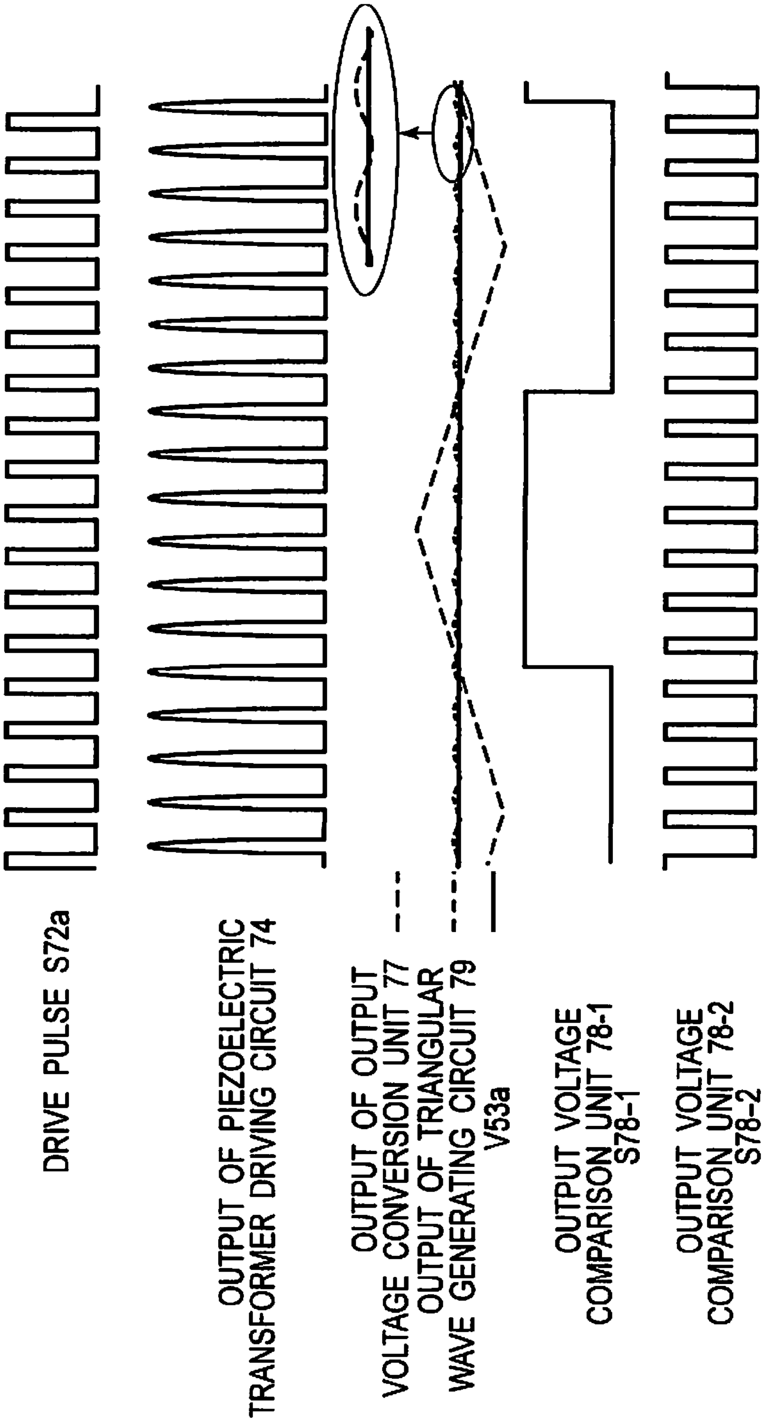
FIG. 14 is a set of operation waveform charts showing signal states near a target voltage in power supply device 70 shown in FIG. 11.

FIG. 14 illustrates operation waveform charts showing the state of each signal in power supply device 70A in FIG. 11 when high voltage output is near a target voltage.

Since PWM duty of comparison result S78-2 output from voltage comparison unit 78-2 is less than 50% as shown in FIG. 14, the frequency division ratio is controlled to decrease so that the frequency is increased in this case. Stable constant-voltage control can be achieved by subtracting or adding the frequency division ratio so as to obtain approximately 50% duty of the rectangular wave of comparison result S78-2 output from output voltage comparison unit 78-2 at a time of obtaining a target voltage.

Modifications of Second Embodiment

In addition to the modifications described above, it is also possible to employ other modifications of the second embodiment as (a) and (b) below.

(a) In the second embodiment, two comparison units are used: one is output voltage comparison unit 78-1 for triangular wave output comparison; and the other is output voltage comparison unit 78-2 for constant voltage comparison. However, two channels for output voltage comparison units 78-1 and 78-2 may be easily combined to a single one over which a constant voltage output and a triangular wave output are alternately output.

(b) In the second embodiment, comparison result S78-1 between the outputs from output voltage conversion unit 77 and triangular wave generating circuit 79 is designed to have a PWM duty of 50% at target voltage V53*a*, but an alternative configuration may be employed in which the triangular wave has a constant peak voltage corresponding to maximum target voltage V53*a*, and DAC preset value D53*a* is input to table register 84A.

Advantageous Effects of Second Embodiment

According to the second embodiment, by providing two output voltage comparison units 78-1 and 78-2 to have separate signals for constant voltage control (comparison result S78-2) and for gain control (comparison result S78-1), constant voltage control more stable than that of the first embodiment is possible and shorter rise time as well as improved control against load fluctuation are achieved.

Other Modifications

The invention is not limited to the examples or modifications described above, but can be applied to other modifications as shown below.

In the above examples, image forming apparatus 1 of a color tandem type is described; however, the invention can be applied to not only image forming apparatuses of color type but also of monochrome and some other types, and also other image forming apparatus such as multifunction devices. Power supply devices 70 and 70A for transfer can be applied to other high voltage power supplies for charging and the like.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A power supply device comprising:

an oscillator configured to output a clock signal;

a pulse output unit configured to output a pulse by dividing a frequency of the clock signal in accordance with a control signal;

a switching element driven by the pulse;

a piezoelectric transformer configured to output a high alternating current voltage from a secondary side thereof when a voltage is intermittently applied to a primary side thereof by the switching element;

a rectifier configured to convert the high alternating current voltage to a high direct current voltage;

an output voltage conversion unit configured to convert the high direct current voltage to a low direct current voltage;

a target setter configured to set and output a target signal; and a comparison unit configured to compare the low direct current voltage with the target signal and to output a comparison result, wherein a frequency division ratio of the pulse is controlled according to the comparison result, and thereby is changed so as to obtain the target signal.

2. The power supply device according to claim 1, wherein the target signal is a triangular wave.

3. The power supply device according to claim 1, wherein the comparison result is a rectangular wave, and a duty of the rectangular wave is 50% of the target signal.

4. The power supply device according to claim 1, wherein the comparison result is a rectangular wave, and an amount of change in the frequency division ratio is varied in accordance with duty of the rectangular wave.

5. The power supply device according to claim 1, wherein the comparison result is a rectangular wave, and an amount of change in the frequency division ratio is varied in accordance with an amount of change in duty of the rectangular wave per unit time.

6. The power supply device according to claim 1, wherein an amount of change in the frequency division ratio is varied in accordance with an amount of voltage change per unit time of the high direct current voltage.

7. The power supply device according to claim 1, wherein a cycle at which the frequency division ratio is changed is varied in accordance with the target signal.

8. The power supply device according to claim 1, wherein the target signal includes two signals which are a triangular wave and a constant voltage, and the comparison unit compares the low direct current voltage with the constant voltage, outputs the comparison result, and controls the frequency division ratio so that the comparison result becomes a rectangular wave.

9. The power supply device according to claim 8, wherein the two signals, which are the triangular wave and the constant voltage, are output alternately from the target setter.

10. The power supply device according to claim 1, wherein the frequency division ratio of the pulse is an average frequency division ratio per unit time.

11. An image forming apparatus comprising the power supply device of claim 1.

12. The image forming apparatus according to claim 11, further comprising: a printer engine configured to print images on paper, wherein the high direct current voltage output from the power supply is applied to at least one component of the printer engine.

13. The image forming apparatus according to claim 12, wherein the printer engine includes:

a developing unit configured to form a toner image;

a image transfer unit configured to transfer the toner image formed by the developing unit to a printable medium; and a fixing unit configured to fix the toner image onto the printable medium.

14. The image forming apparatus according to claim 13, wherein the developing unit includes:

a photosensitive drum having a photosensitive surface;

a charging unit configured to charge the photosensitive surface of the photosensitive drum;

an exposure unit configured to emit light onto the charged photosensitive surface so as to form a latent image on the photosensitive surface; and a toner supplying unit configured to supply toner to the latent image on the photosensitive surface so as to form a toner image on the photosensitive surface.

15. The image forming apparatus according to claim 14, wherein the image transfer unit includes:

a image transfer roller disposed to face the photosensitive unit; and a belt configured to convey the printable medium through a nip between the transfer roller the photosensitive drum.

16. The image forming apparatus according to claim 11, further comprising:

a developing unit configured to form a toner image;

an image transfer unit configured to receive the high voltage DC output from the power supply device and to generate a transfer bias voltage thereby transferring the toner image formed by the developing unit to a printable medium; and a fixing unit configured to fix the toner image onto the printable medium.

* * * * *